(12) United States Patent
Teramoto et al.

(10) Patent No.: US 8,748,198 B2
(45) Date of Patent: Jun. 10, 2014

(54) METHOD OF MANUFACTURING SEMICONDUCTOR DEVICE

(75) Inventors: Naoyuki Teramoto, Kanagawa (JP);
Megumu Fukazawa, Kanagawa (JP);
Masayuki Kumashiro, Kanagawa (JP);
Kiyoshi Kawagashira, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 56 days.

(21) Appl. No.: 13/524,075

(22) Filed: Jun. 15, 2012

(65) Prior Publication Data

US 2012/0322169 A1 Dec. 20, 2012

(30) Foreign Application Priority Data

Jun. 16, 2011 (JP) .................................. 2011-133779

(51) Int. Cl.
*H01L 21/00* (2006.01)

(52) U.S. Cl.
USPC ................... 438/7; 438/10; 438/16; 438/622; 438/633; 438/636

(58) Field of Classification Search
None
See application file for complete search history.

(56) References Cited

U.S. PATENT DOCUMENTS

| 6,163,366 A | * | 12/2000 | Okamoto et al. | 355/53 |
| 2001/0018153 A1 | * | 8/2001 | Irie | 430/5 |

FOREIGN PATENT DOCUMENTS

| JP | 4-058250 A | 2/1992 |
| JP | 5-182897 A | 7/1993 |
| JP | 9-260269 A | 10/1997 |
| JP | 2005-129781 A | 5/2005 |

* cited by examiner

*Primary Examiner* — Kyoung Lee
(74) *Attorney, Agent, or Firm* — Miles & Stockbridge P.C.

(57) ABSTRACT

A focus through a projection lens is corrected to prevent the occurrence of a dimensional error in a pattern due to defocusing. At least one automatic focus correction mark is formed over each of chip patterns formed in a reticle used for exposure. Using one of the automatic focus correction marks located in the center portion of an actual device region, automatic correction of the focus of exposure light is performed. In this manner, a variation in the focus of the exposure light through the center portion of the projection lens, which is more likely to reach a high temperature than an end portion of the projection lens, is detected and corrected.

13 Claims, 18 Drawing Sheets

METHOD OF MANUFACTURING SEMICONDUCTOR DEVICE

CROSS-REFERENCE TO RELATED APPLICATIONS

The disclosure of Japanese Patent Application No. 2011-133779 filed on Jun. 16, 2011 including the specification, drawings and abstract is incorporated herein by reference in its entirety.

BACKGROUND

The present invention relates a method of manufacturing a semiconductor device, and particularly to a technology which is effective when applied to the manufacturing of a semiconductor device including an exposure step using a reticle.

In a manufacturing step of a semiconductor device, when a film over a semiconductor substrate is patterned using photolithographic technique, exposure to light for projecting a pattern over a reticle (photomask) is performed to form a photoresist film into a desired shape. At this time, a part of exposure light is blocked by passing through the reticle, and the exposure light transmitted by the reticle is reduced in size by passing through a projection lens to irradiate a surface of a semiconductor substrate (wafer). In this manner, the pattern provided over the reticle is reduced in size and projected on the photoresist film. At this time, to cause the light transmitted and projected by the projection lens to be focused on the main surface of the semiconductor substrate, a known method is used in which an automatic focus correction mark (alignment mark) provided over a recto (region where products are not formed) located outside an actual device region in a center portion of the reticle is projected on a photosensitive substrate (detector) formed over a wafer stage over which a semiconductor substrate is mounted to determine an optimum focus position.

In Japanese Unexamined Patent Publication No. 2005-129781 (Patent Document 1), it is stated that alignment marks are provided over a chip region and thereby increase the occupation ratio of the chip region over a wafer to a value higher than in a case where alignment marks are provided in a scribe line region. Here, it is stated that respective alignment marks are disposed in at least two chips through which an X-axis and a Y-axis passing through the center of a reticle extend.

In Japanese Unexamined Patent Publication No. Hei 5(1993)-182897 (Patent Document 2), an exposure apparatus is described which uses a value measured using a TTL (Through the Lens) autofocus system to perform exposure in an optimal focal plane in consideration of the properties of a projection lens.

In Japanese Unexamined Patent Publication No. Hei 4(1992)-58250 (Patent Document 3), it is stated that, by using a slit-like correction pattern formed over a reticle, an amount of displacement between an autofocus system and an exposure optical system is automatically corrected.

In Japanese Unexamined Patent Publication No. Hei 9(1997)-260269 (Patent Document 4), it is stated that, in a projection exposure apparatus, a pattern formed over a reticle is projected onto a photosensitive substrate by exposure, the state of an image of the pattern formed on the photosensitive substrate is detected to allow an optimal focus position to be determined, and the optimal focus position over a stage is corrected based on a plurality of mark focus positions. Here, marks (light transmitting portions) for correcting the focus position are provided outside the actual device region of the reticle.

RELATED ART DOCUMENTS

Patent Documents

[Patent Document 1]
  Japanese Unexamined. Patent Publication No. 2005-129781
[Patent Document 2]
  Japanese Unexamined Patent Publication No. Hei 5(1993)-182897
[Patent Document 3]
  Japanese Unexamined Patent Publication No. Hei 4(1992)-58250
[Patent Document 4]
  Japanese Unexamined Patent Publication No. Hei 9(1997)-260269

SUMMARY

In a projection exposure apparatus, a wafer stage over which a wafer is mounted is moved in a vertical direction using an automatic focus correcting function to control a focus in an exposure field. In this case, a method can be considered in which exposure light applied to an automatic focus correction mark formed over a region (recto) of the surface of a reticle located outside the actual device region (product region) thereof is projected on a reference mark provided over the wafer stage such that a photosensitive element (detector) under the reference mark detects the exposure light to determine an optimal focus position (best focus).

When the step of exposing a photosensitive film such as a photoresist film to light is repeated, it follows that the exposure light is repeatedly applied to the projection lens, and the center portion of the projection lens having a particularly low heat release property reaches a high temperature. Consequently, the lens shape of the center portion is deformed or the refractivity of the center portion is changed. On the other hand, an end portion (outer peripheral portion) of the projection lens having a high heat release property is less likely to hold heat and has a low possibility of being deformed, unlike the center portion of the projection lens. Accordingly, the exposure light transmitted by the end portion of the projection lens to be applied is less likely to be out of focus.

The exposure light for projecting the automatic focus correction mark formed over the rect is transmitted by the end portion of the projection lens and applied to the photosensitive element. This results in the problem that, even if the exposure light applied to the actual device region of a semiconductor substrate through the center portion of the projection lens is out of focus, the out-of-focus state cannot be detected. In this case, even when a focus correcting operation is performed using the automatic focus correction mark, the focus of the exposure light transmitted by the center portion of the projection lens cannot be corrected. As a result, defocusing occurs to cause a dimensional error in a pattern formed over the semiconductor substrate.

An object of the present invention is to provide a technique for preventing a failure in pattern formation for a semiconductor device.

The above and other objects and novel features of the present invention will become apparent from a statement in the present specification and the accompanying drawings.

The following is a brief description of the outline of a representative aspect of the invention disclosed in the present application.

That is, a method of manufacturing a semiconductor device of the present invention includes the steps of: (a) preparing a reticle having a plurality of chip patterns in an actual device region thereof, and including at least one first alignment mark in each of the chip patterns; (b) preparing a semiconductor substrate; (c) forming an object to be processed in the semiconductor substrate; (d) forming a photoresist film over the object to be processed; and (e) exposing the photoresist film to light using the reticle.

The following is a brief description of effects achievable by the representative aspect of the invention disclosed in the present application.

That is, according to a representative embodiment, failure in pattern formation for a semiconductor device can be prevented.

DETAILED DESCRIPTION

Figure 1:
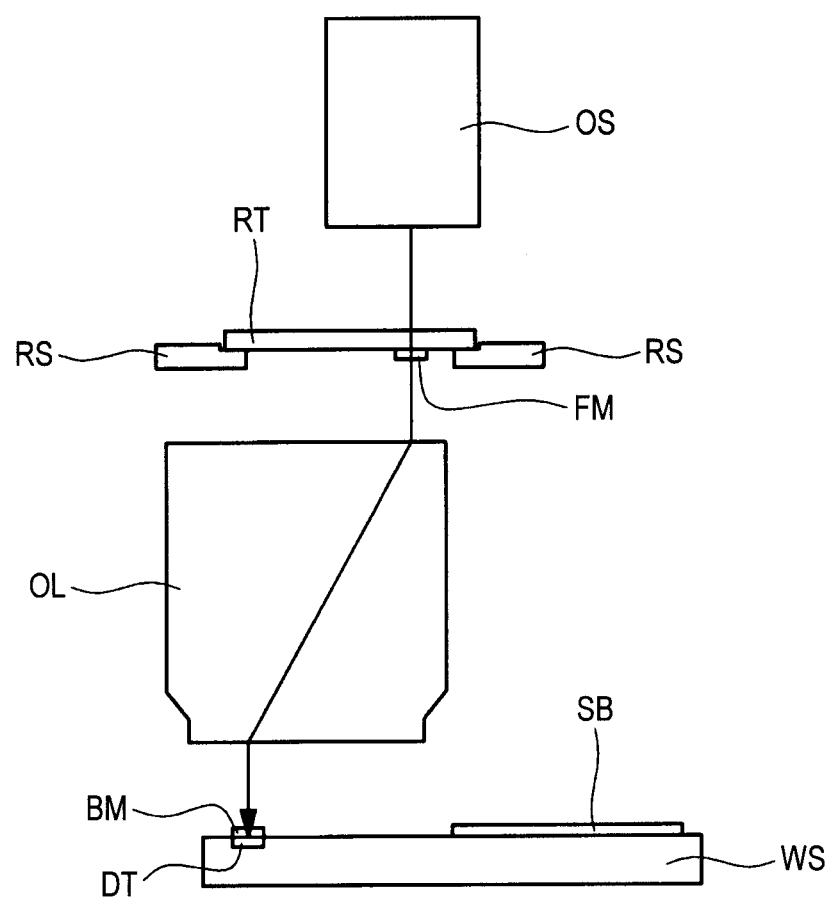
FIG. 1 is a schematic view of a projection exposure apparatus used in the manufacturing steps of a semiconductor device as a first embodiment of the present invention.

The embodiments of the present invention will be described below in greater detail based on the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the following embodiments, even a plan view may be partially hatched for clarity of illustration.

(First Embodiment)

Figure 2:
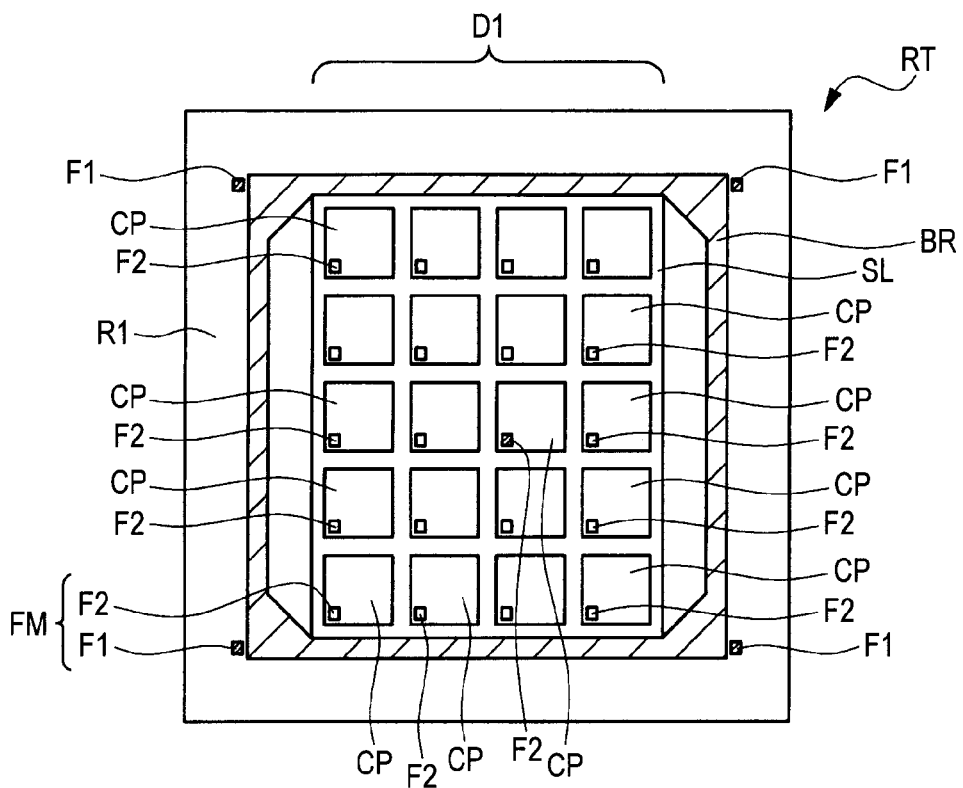
FIG. 2 is a plan view of a reticle used in the manufacturing steps of the semiconductor device as the first embodiment of the present invention.
Figure 3:
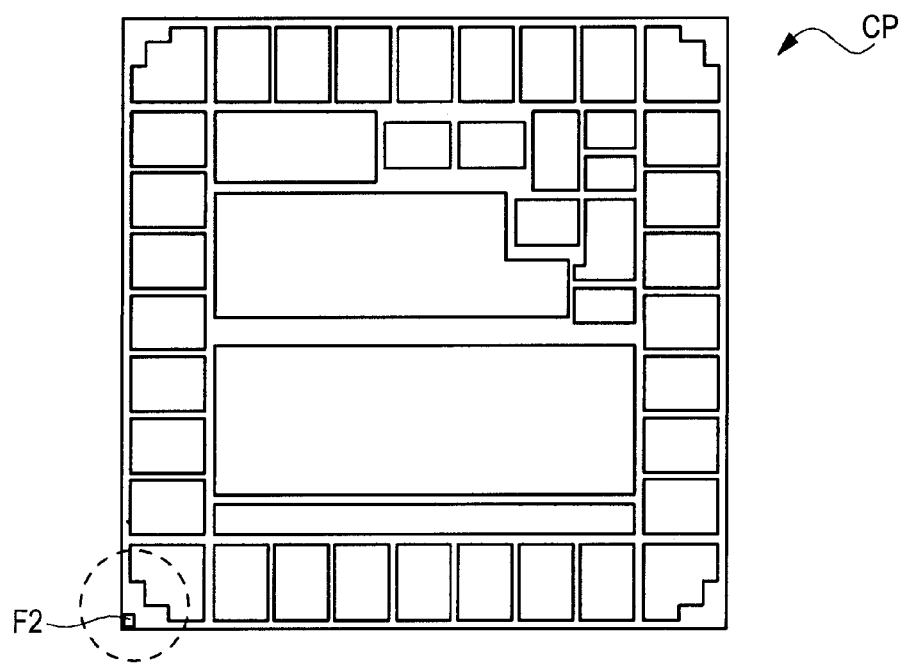
FIG. 3 is a plan view showing one chip pattern of the reticle used in the manufacturing steps of the semiconductor device as the first embodiment of the present invention.
Figure 4:
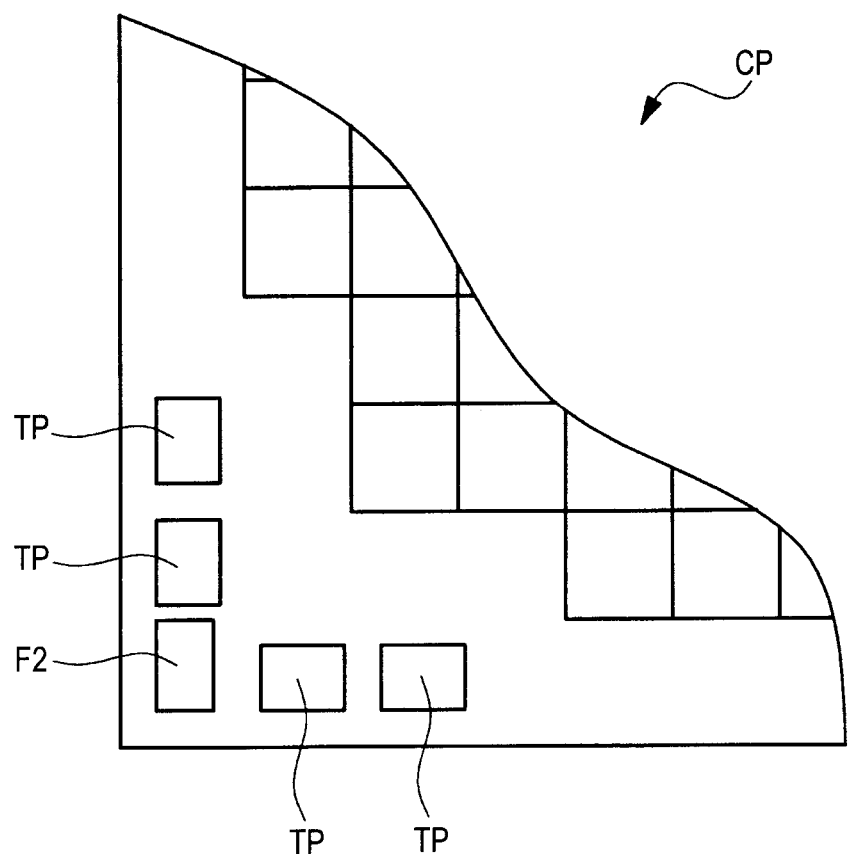
FIG. 4 is a plan view showing, under magnification, a part of the chip pattern of the reticle used in the manufacturing steps of the semiconductor device as the first embodiment of the present invention.
Figure 5:
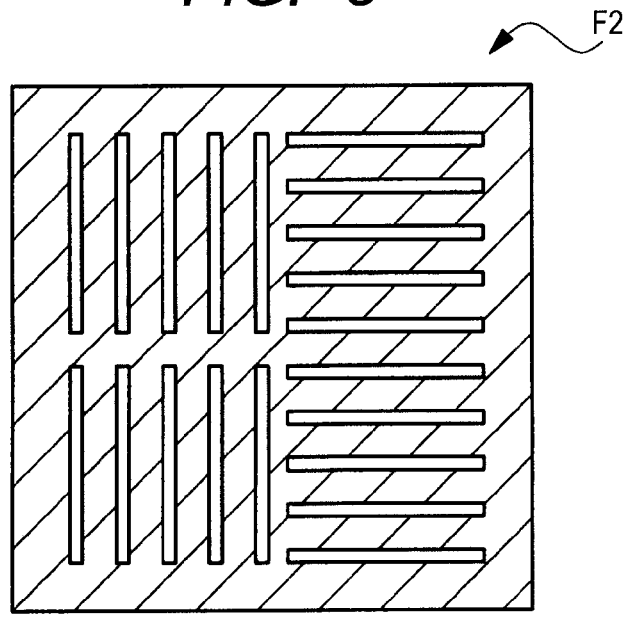
FIG. 5 is a plan view showing, under magnification, a part of the reticle used in the manufacturing steps of the semiconductor device as the first embodiment of the present invention.

First, a description will be given to a projection exposure apparatus and a reticle which are used in the manufacturing steps of a semiconductor device of the first embodiment with reference to FIGS. 1 to 5. The first embodiment pertains to a method of manufacturing a semiconductor device including the step of exposing a photosensitive film formed over a semiconductor substrate to light using the projection exposure apparatus shown in FIG. 1. FIG. 1 is a schematic view of the projection exposure apparatus having an automatic focus correcting function. FIG. 2 is a plan view of the reticle. FIGS. 3 to 5 are plan views showing a part of the reticle under magnification. The description will be given herein on the assumption that the projection exposure apparatus shown in FIG. 1 is a stepper which projects a device pattern onto the main surface of the semiconductor substrate using a step-and-repeat technique.

As shown in FIG. 1, the projection exposure apparatus is a stand for mounting thereover a semiconductor substrate (semiconductor wafer) SB, and has a wafer stage (XYZ stage) WS movable in vertical, lateral, and front-rear directions. Over the wafer stage, an exposure illumination system OS including a light source for emitting exposure light, lenses for adjusting the direction in which the exposure light is applied, and the like is disposed. Between the exposure illumination system OS and the wafer stage WS, a reticle RT mounted over a reticle stage RS is disposed. Between the reticle RT and the wafer stage WS, a projection optical system OL including a plurality of projection lenses is disposed.

The reticle RT is an original plate having a pattern containing, e.g., chromium (Cr) formed over the surface thereof, and having light transmittance. In the step of exposing the semiconductor substrate, the exposure light from the exposure illumination system OS is applied to the reticle RT, and the exposure light transmitted by the region of the reticle RT where a pattern is not formed is applied to the surface of the semiconductor substrate SB over the wafer stage WS via the projection lenses in the projection optical system OL to expose a photosensitive film over the upper surface of the semiconductor substrate SB into a pattern shape obtained by reducing the pattern formed over the reticle RT. At this time, the pattern formed over the reticle RT is reduced to about ¼ to ⅕ of the original size to be projected on the upper surface of the semiconductor substrate SB. In FIG. 1, the trace of light at the time of projecting the exposure light is shown by the arrow.

In the exposure step, a minute pattern formed in the reticle RT is further reduced and projected so that it is important to perform precise positioning of the semiconductor substrate SB to be exposed in the XY-directions, precise focusing of exposure light onto the semiconductor substrate SB, or the like. Here, to irradiate the semiconductor substrate SB with the exposure light at an optimal focus (best focus) position, the surface of the reticle RT is provided with automatic focus correction marks (alignment marks) FM formed as a part of the chromium pattern containing chromium. There are also provided a reference mark BM formed over the wafer stage WS and a light receiving element (detector) DT formed in the upper surface of the wafer stage WS under the reference mark BM.

When the focus of the exposure light is adjusted using the automatic focus correcting function, the exposure light is emitted from the exposure illumination system OS to be projected on the light receiving element DT through the reticle RT, automatic focus correction marks FM, and the projection lenses in the projection optical system OL. If the wafer stage WS is vertically moved in a state where the light receiving element DT senses the exposure light, an output of the light detected by the light receiving element DT becomes maximum when the exposure light is focused. This allows the position of the wafer stage WS which optimizes the focus of the exposure light to be determined. By such an operation, it is possible to automatically correct the focus of the exposure light, and perform exposure at the optimal focus position. Note that, over the surface of the reticle RT, the plurality of automatic focus correction marks FM are formed, but only one of the automatic focus correction marks FM is shown for clarity of illustration.

FIG. 2 shows a plan view of the reticle RT. FIG. 2 is a view showing the layout of the chromium pattern formed in the same layer on the main surface side of the reticle RT. In FIG. 1, the reticle RT is disposed with the surface thereof formed with the chromium pattern facing downward. As shown in FIG. 2, the center portion of the surface of the reticle RT is provided with an actual device region D1 formed with the chromium pattern for projecting the pattern shape of devices (products). In the peripheral edge portion of the surface of the reticle RT, a recto (peripheral region) R1 over which the chromium pattern of the devices (products) is not formed is provided so as to surround the actual device region D1. The actual device region D1 is a region where the chromium pattern can be projected on the semiconductor substrate by exposure using the projection lenses. The recto R1 as a region outside thereof is a region from which, even when a wiring pattern is formed, it is difficult to project the pattern shape thereof on the semiconductor substrate. That is, over the recto R1, the chromium pattern for forming the product pattern over the semiconductor substrate is not formed.

Between the actual device region D1 and the recto R1, a light blocking range BR as a part of the chromium pattern is formed to separate the actual device region D1 and the recto R1 When a device pattern in the actual device region D1 is projected on the semiconductor substrate, the entire surface of the rectangular device pattern is simultaneously projected by exposure onto the upper surface of the semiconductor substrate. Then, the region other than the region projected on the semiconductor substrate by the foregoing exposure step (e.g., the region adjacent to the region projected in the previous exposure step) is subjected to the same exposure projection as performed in the foregoing exposure step. By a step-and-repeat process in which the exposure step is thus repeated, a largest possible amount of the device pattern is projected on the upper surface of the semiconductor substrate. Note that, here, for clarity of illustration, the light blocking range BR is hatched. For a scanner described later, an exposure method different from that used for the stepper which performs exposure according to the step-and-repeat process is used.

The device pattern in the actual device region D1 shown in FIG. 2 includes a plurality of rectangular chip patterns CP arranged in the X-direction and the Y-direction orthogonal to the X-direction, each extending along the main surface of the reticle RT, into a matrix configuration. The semiconductor substrate including the pattern formed by projecting the chip patterns CP thereon is subjected to dicing in the subsequent step to be singulated into a plurality of semiconductor chips. Accordingly, between the chip patterns CP, predetermined spacings are provided and, in the regions between the individual chip patterns CP, scribe lines SL are provided. The scribe lines SL are regions for cutting the semiconductor substrate by means of a dicing blade when the semiconductor substrate is singulated into the individual semiconductor chips, and disposed so as to surround each of the chip patterns CP from the outside thereof. Since the chip patterns CP are arranged in the matrix configuration, the scribe lines SL passing therebetween have a grid-like plan shape. Note that, here, a region including the chip patterns CP and the scribe lines SL is called the actual device region D1. The actual device region has a rectangular plan shape.

The light blocking range BR has such a quadrilateral linear shape as to surround the actual device region D1. Over the respective portions of the recto R1 located outside the both ends of the opposing two of the four sides forming the light blocking range BR, automatic focus correction marks (alignment marks) F1, which are among the plurality of automatic focus correction marks FM described above, are formed. That is, over the respective portions of the recto R1 located in the vicinity of the four corners of the rectangular light blocking range BR, the automatic focal correction marks F1 each forming a part of the chromium pattern are formed. The automatic focus correction marks F1 are alignment marks disposed not in the center portion of the reticle RT, but in the end portion thereof.

Heretofore, the description has been given to the configuration in which the automatic focus correction marks F1 are formed over the respective portions the recto R1 located in the vicinity of the four corners of the light blocking range BR. However, it may also be possible to additionally form automatic correction marks over the respective portions of the recto R1 located in the vicinity of the middles of the opposing two of the four sides forming the light blocking range BR. In other words, the automatic correction marks may also be formed over the regions of the recto R1 located in the vicinity of the light blocking range BR and at positions overlapping a center line passing through the center point of the actual device region D1 and extending in the X-direction so as to face each other with the foregoing center point interposed therebetween.

In the first embodiment, each of the plurality of chip patterns CP is provided with at least one automatic focus correction mark (alignment mark) F2. The automatic focus correction mark F2 is formed within the outer peripheral portion of each of the chip patterns CP. Thus, over the main surface of the reticle RT, the automatic focus correction marks F1 and F2 the number of which is larger than the total number of the chips formed in the actual device region D1 are formed. The automatic focus correction marks F2 include those formed in the center portion of the reticle RT and those formed in the end portion of the reticle RT.

FIG. 3 shows a plan view obtained by enlarging one of the chip patterns CP in the actual device region D1 of FIG. 2. As shown in FIG. 3, over the chip pattern CP, the chromium pattern for forming a wiring pattern and the like in the semiconductor chip formed by processing the semiconductor substrate is formed. Note that not the whole chromium pattern over the chip pattern CP is provided for the purpose of forming a pattern for operating the semiconductor chip. The automatic focus correction mark F2 described above is used to focus the exposure light. In addition, there are also a test pattern for inspecting whether or not a device in the formed semiconductor chip normally operates and the like.

FIG. 4 shows a plan view obtained by enlarging the region enclosed by the broken line in FIG. 3, which is one of the corner portions of the rectangular chip pattern CP. The corner portion of the chip pattern CP shown in FIG. 4 is formed with the automatic focus correction mark F2. A plurality of test patterns TP are formed to be arranged in the X-direction and in the Y-direction of the automatic focus correction marks F2. That is, the test patterns are arranged along one of the sides of the chip pattern CP, and the automatic focus correcting mark F2 is disposed in the vicinity of the end portion of one of the sides of the chip pattern CP. As shown in FIGS. 3 and 4, only one of the automatic focus correction marks F2 is disposed over one of the chip patterns CP. However, the automatic focus correction marks F2 may also be formed on the four respective corners of the chip pattern CP. The regions where the automatic focus correction marks F2 are formed are not limited to the corner portions of the chip pattern CP. The automatic focus correction marks F2 may also be provided in other regions in the chip pattern CP. In the region outside the chip pattern PC, there is the scribe line SL (see FIG. 2), though not shown in FIGS. 3 and 4.

Here, as shown in FIG. 4, the test patterns TP and the automatic focus correction mark F2 are not formed in the same region in the chip pattern CP as the region where the wiring pattern or the like is formed, but are disposed in a region which is originally not used for the formation of the wiring pattern or the like. Therefore, even if the automatic focus correction mark F2 is provided in the chip pattern CP so as to be provided in the vicinity of a surplus region where the test pattern TP or the like is present, there is no sacrifice of the space in the chip pattern CP compared to the case where the automatic focus correction mark F2 is not provided at all. That is, since the automatic focus correction mark F2 is provided in the end portion of the chip pattern CP, there is no deterioration of the degree of integration of the semiconductor device resulting from the provision of the automatic focus correction mark F2.

As shown in FIG. 5, the automatic focus correction mark F2 is formed of the chromium pattern having a plurality of slit-like clearances. FIG. 5 is a plan view showing the automatic focus correction mark F2 shown in FIGS. 2 and 3 under magnification. Here, for clarity of illustration, the region where the chromium pattern is formed is hatched. The automatic focus correction mark F2 is comprised of the plurality of slits extending in the X-direction and arranged in the Y-direction, and the plurality of slits formed in the vicinities thereof, extending in the Y-direction, and arranged in the X-direction. Note that each of the automatic focus correction marks F1 shown in FIG. 2 has the same structure.

When the focus of the exposure light on the wafer stage of the projection exposure apparatus is to be automatically corrected, the slits of the automatic focus correction marks F1 or F2 described above are irradiated with the exposure light, and the exposure light transmitted by the foregoing slits and the projection lenses is caused to form an image of the pattern of the foregoing slits on the light receiving element DT over the wafer stage WS shown in FIG. 1. The light receiving element has a shape corresponding to the image projected via the automatic focus correction mark EM formed over the reticle RT. That is, the light receiving element DT has a plan shape including a pattern in the form of the plurality of stripes extending in the X-direction and arranged in the Y-direction, and a pattern in the form of the plurality of stripes formed in the vicinity thereof, extending in the Y-direction, and arranged in the X-direction.

For the light receiving element DT, e.g., a photodiode is used. When the wafer stage WS is moved in the vertical direction (Z-direction), the position at which the exposure light transmitted by the slits of the automatic focus correction mark FM and projected has the highest intensity serves as the best focus position when the semiconductor substrate SB over the wafer stage WS is subjected to exposure. By such an operation, the best focus position can be detected and, by subsequently exposing the semiconductor substrate SB, the exposure can be performed at the optimal focal distance.

Note that, when the exposure of the semiconductor substrate SB is performed in a state where the focal distance is not optimum, and the projected image of the exposure light is blurred, in the region where the projected image is out of focus, a phenomenon (defocusing) occurs in which the exposure light for irradiating a photoresist film formed as a film to be exposed over the semiconductor substrate SB is not applied thereto in a direction perpendicular to the main surface of the semiconductor substrate SB, but is applied thereto at various angles. It is intrinsically desirable that the side walls of the photoresist film formed over the semiconductor substrate SB by a photolithographic technology are formed perpendicular to the main surface of the semiconductor substrate SB. However, in the case where defocusing has occurred, when the photoresist film is developed after the exposure step, the tapered photoresist film remains over the side walls. As a result, it is no longer possible to form the photoresist film having desired width.

When an insulating film, a conductive film, or the like is patterned using a photoresist film having such a shape error as a mask by an etching method, a problem occurs such as, e.g., a wiring line with a dimensional error which is thinner than or thicker than a desired thickness, a significant displacement of the pattern, or the like. When ion implantation is performed using the photoresist film having a shape error as described above into the semiconductor substrate SB or the like, problem occurs such as a shift of a position where the ion implantation is performed or a local reduction in the density of implanted ions.

In the manufacturing steps of the semiconductor device of the first embodiment, automatic focus correction is performed using one of the automatic focus correction marks F2 in the center portion of the actual device region D1 shown in FIG. 2 and the automatic focus correction marks F1 provided over the recto R1 to thereby allow the chip patterns CP in the actual device region D1 to be exposed as a whole at a focus position close to the best focus position when the chromium pattern over the actual device region D1 is projected on the semiconductor substrate SB.

A description will be given below to the manufacturing steps of the semiconductor device of the first embodiment using FIGS. 6 to 21. FIGS. 6 to 12, 14, 15, and 17 to 21 are cross-sectional views of the semiconductor device of the first embodiment, e.g., a semiconductor device having an n-channel field-effect transistor (MISFET: Metal Insulator Semiconductor. Field Effect Transistor) in the manufacturing steps thereof. In each of FIGS. 6 to 12, 14, 15, and 17 to 21, a p-channel MISFET formation region Al is shown on the left side of the drawing, an n-channel MISFET formation region B1 is shown in the middle of the drawing, and a correction-mark projection exposure region C1 which is a region serving as an end portion of a semiconductor chip and irradiated with exposure light in the form of the slits of the automatic focus correction mark F2 shown in FIG. 5 is shown on the right side of the drawings.

Figure 6:
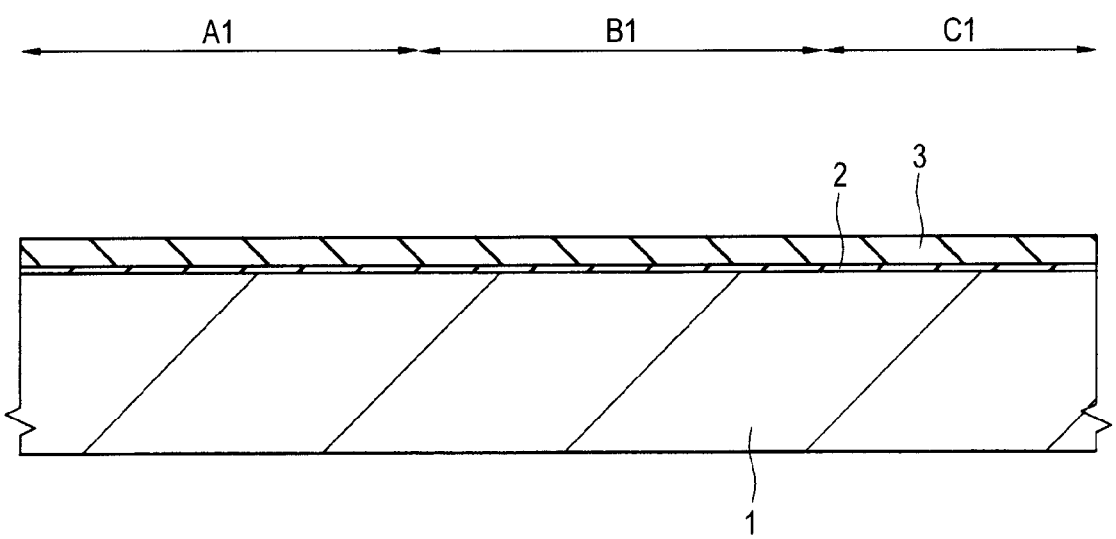
FIG. 6 is a cross-sectional view illustrating the manufacturing step of the semiconductor device as the first embodiment of the present invention.

First, as shown FIG. 6, a semiconductor substrate (semiconductor wafer) 1 comprised of p-type single-crystal silicon or the like and having a specific resistance of, e.g., about 1 to 10 Ωcm is prepared. Next, the semiconductor substrate 1 is thermally oxidized to form an insulating film 2 having a thickness of, e.g., about 11 nm over the surface thereof. Then, by a CVD (Chemical Vapor Deposition) method or the like, an insulating film 3 having a thickness of, e.g., about 90 nm is deposited in a layer located thereover. The insulating film 2 is comprised of a silicon oxide or the like. The insulating film 3 is comprised of a silicon nitride film or the like.

Figure 7:
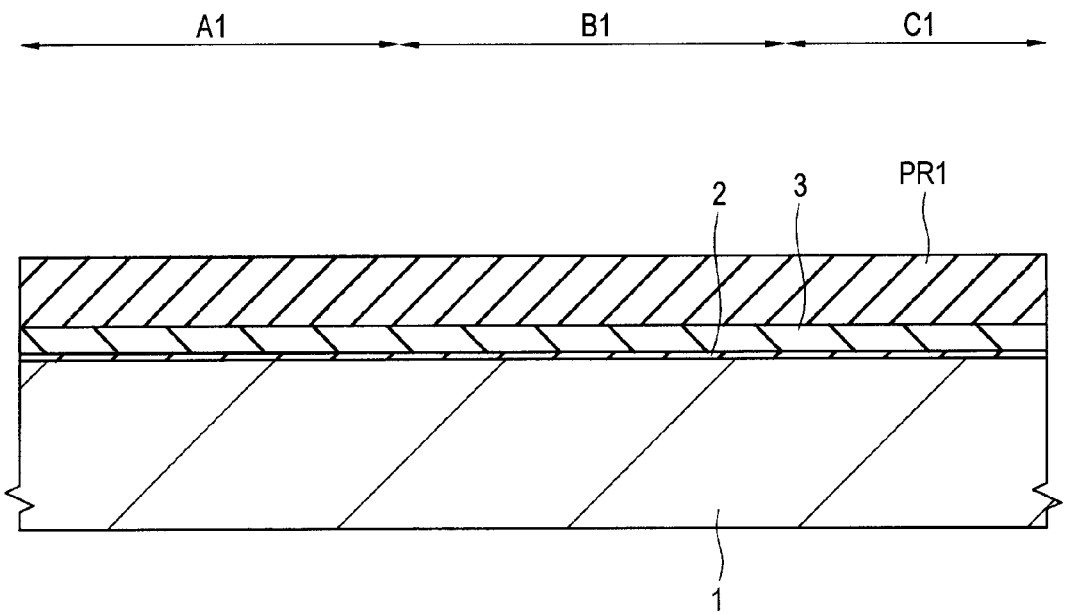
FIG. 7 is a cross-sectional view of the semiconductor device in the manufacturing step thereof subsequent to that of FIG. 6.

Next, as shown in FIG. 7, a photoresist film PR1 is coated over the entire upper surface of the semiconductor substrate 1.

Figure 8:
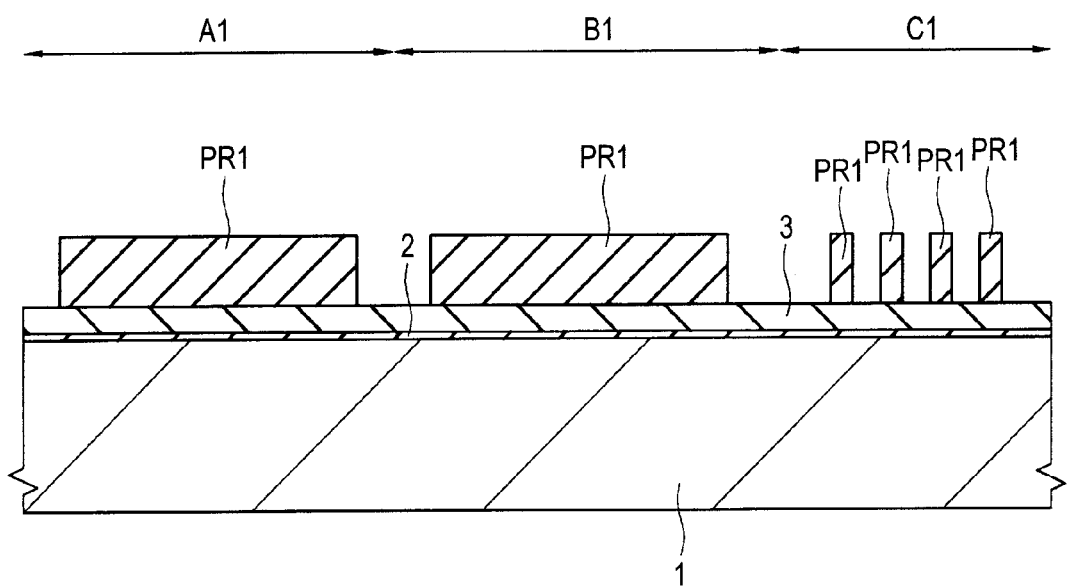
FIG. 8 is a cross-sectional view of the semiconductor device in the manufacturing step thereof subsequent to that of FIG. 7.

Next, as shown in FIG. 8, using the projection exposure apparatus shown in FIG. 1, the photoresist film PR1 is exposed. Subsequently, after development is performed thereon, the unneeded portion of the photoresist film PR1 is removed to leave a photoresist pattern comprised of the photoresist film PR1 over the semiconductor substrate 1. At this time, in the correction-mark projection exposure region C1, the photoresist film PR1 having a striped shape corresponding to the slit-like shapes of the automatic focus correction marks remains over the insulating film 3. Note that, before the photoresist film PR1. is exposed, to perform exposure at an optimum focus, the automatic focus correction for the projection exposure apparatus described using FIGS. 1 to 5 is performed. A detailed method of the automatic correction will be described later.

Figure 9:
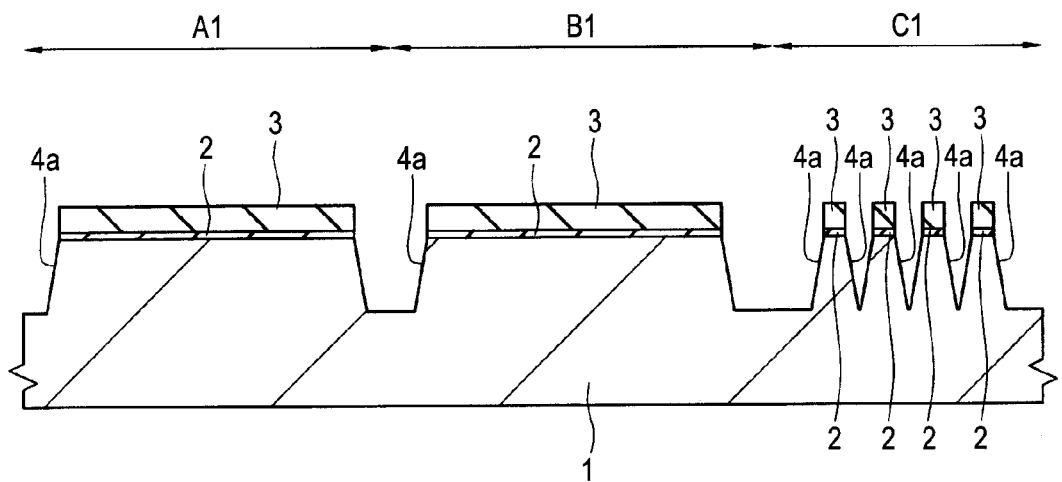
FIG. 9 is a cross-sectional view of the semiconductor device in the manufacturing step thereof subsequent to that of FIG. 8.

Next, as shown in FIG. 9, using the photoresist film PR1 as an etching mask, the insulating films 3 and 2 and the semiconductor substrate 1 are successively subjected to dry etching to form trenches (trenches for isolation) 4a each having a thickness of, e.g., about 300 nm in the regions of the semiconductor substrate 1 where isolations are to be formed. Then, ashing using an oxygen plasma or the like is performed to remove the photoresist film PR1. The trenches 4a are for isolation, i.e., for the formation of an isolation region 4 described later.

Figure 10:
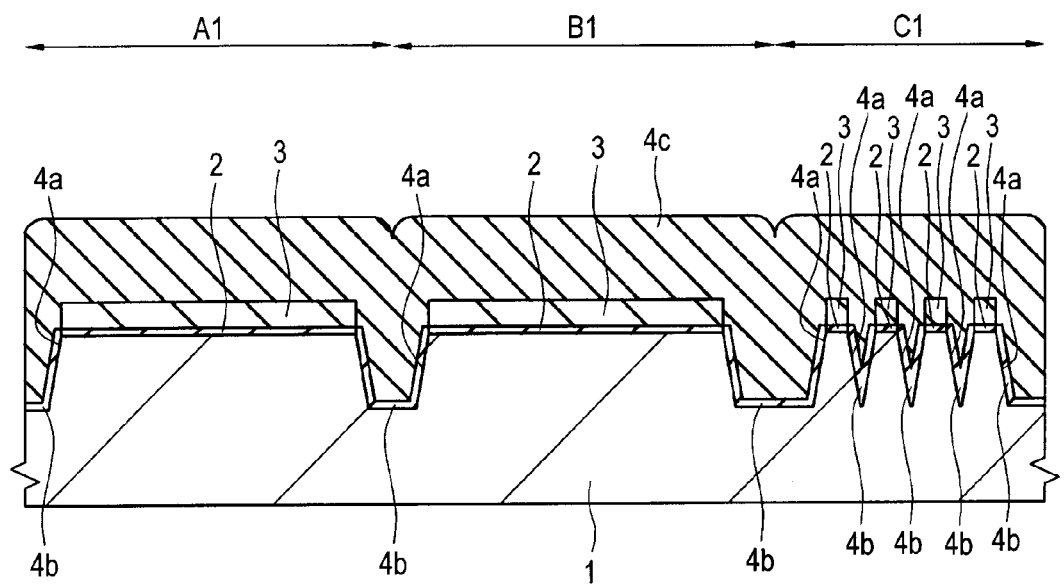
FIG. 10 is a cross-sectional view of the semiconductor device in the manufacturing step thereof subsequent to that of FIG. 9.

Next, as shown in FIG. 10, over the main surface of the semiconductor substrate 1 including the insides (sidewalls and bottom portions) of the trenches 4a, an insulating film 4b having a thickness of, e.g., about 10 nm is formed. Then, an insulating film 4c is formed (deposited) by a CVD method or the like over the main surface (i.e., over the insulating film 4b) of the semiconductor substrate 1 so as to fill the trenches 4a.

The insulating film 4b is comprised of a silicon oxide film or a silicon oxynitride film. When the insulating film 4b is an oxynitride film, an effect is obtained by which volume expansion resulting from the oxidation of the side walls of the trenches 4a due to a heat treatment after the step of forming the insulating film 4b can be prevented, and a compressive stress acting on the semiconductor substrate 1 can be reduced.

The insulating film 4c is a silicon oxide film deposited by a HDP-DVD (High Density Plasma CVD) method, an $O_3$-TEOS oxide film, or the like. Note that the $O_3$-TEOS oxide film is a silicon oxide film formed by a thermal CVD method using $O_3$ (ozone) and TEOS (Tetraethoxysilane or Tetra Ethyl Ortho Silicate) as raw material gases (source gases).

Subsequently, by subjecting the semiconductor substrate 1 to a heat treatment at, e.g., about 1150° C., the insulating film 4c buried in the trenches 4a is baked. In a state before the baking, the silicon oxide film deposited by the HDP-CVD method is denser than the $O_3$-TEOS oxide film. Accordingly, in the case where the insulating film 4c is the $O_3$-TEOS oxide film, the compression of the insulating film 4c due to the baking achieves the effect of allowing a reduction in the compressive stress acting on the semiconductor substrate 1.

Figure 11:
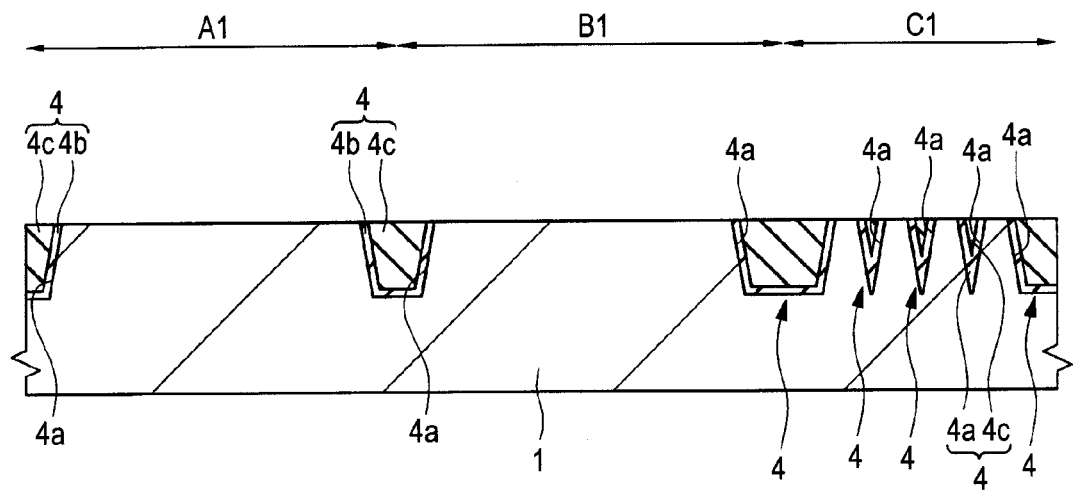
FIG. 11 is a cross-sectional view of the semiconductor device in the manufacturing step thereof subsequent to that of FIG. 10.

Next, as shown in FIG. 11, the insulating film 4c is polished by a CMP (Chemical Mechanical Polishing) method to expose the insulating film 3. After the insulating film 3 is removed by wet etching using a hot phosphoric acid or the like, the insulating film 4c and the insulating film 2 which are located outside the trenches 4a are removed using an aqueous hydrofluoric acid (HF) solution or the like to leave the insulating films 4b and 4c in the trenches 4a, and thereby form the isolation region (isolation) 4. In the correction-mark projection exposure region C1, the striped isolation region 4 is formed.

In this manner, the isolation region 4 comprised of the insulating films 4b and 4c buried in the trenches 4a is formed. In the first embodiment, the isolation region 4 is formed not by a LOCOS (Local Oxidation of Silicon) method, but by a STI (Shallow Trench Isolation) method. That is, the isolation region 4 of the first embodiment is preferably comprised of an insulator (which is insulating films 4b and 4c herein) buried in the trench 4a for isolation formed in the semiconductor substrate 1. An n-channel MISFET Qn (i.e., a gate insulating film 7, a gate electrode 8a, source/drain n$^-$-type semiconductor regions 9a, and source/drain n$^+$-type semiconductor regions 9b which form the n-channel MISFET Qn) described later is formed in an active region defined by (surrounded by) the isolation region 4.

Figure 12:
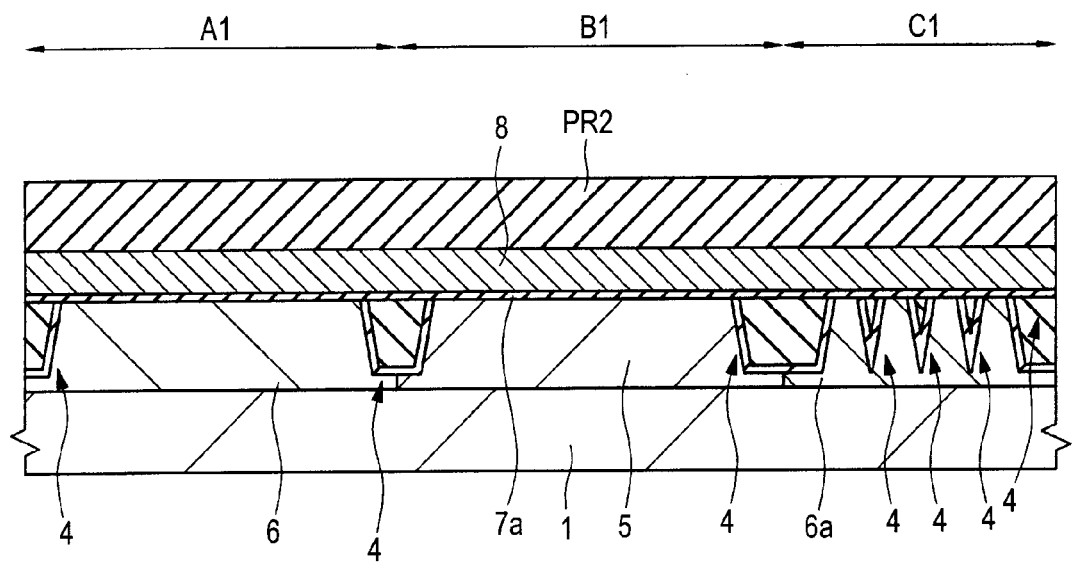
FIG. 12 is a cross-sectional view of the semiconductor device in the manufacturing step thereof subsequent to that of FIG. 11.

Next, as shown in FIG. 12, a p-type well 5 and an n-type well 6 are formed to predetermined depths from the main surface of the semiconductor substrate 1. The p-type well 5 can be formed by ion-implanting a p-type impurity such as, e.g., boron (B) into the semiconductor substrate 1 in the n-channel MISFET formation region using a photoresist film (not shown) covering the p-channel MISFET formation region as an ion implantation inhibiting mask. On the other hand, the n-type well 6 can be formed by ion-implanting an n-type impurity such as, e.g., phosphorus (P) or arsenic (As) into the semiconductor substrate in the p-channel MISFET formation region using another photoresist film (not shown) covering the n-channel MISFET formation region as an ion implantation inhibiting mask. Note that, when a pattern of the foregoing photoresist film which is not shown is formed also, the projection exposure apparatus shown in FIG. 1 is used and, after the coating of the foregoing photoresist film and prior to the step of exposing the photoresist film, the automatic focus correction described using FIGS. 1 to 5 is performed.

When the p-type well 5 and the n-type well 6 are formed, in the main surface of the semiconductor substrate 1 exposed in a striped shape in the correction-mark projection exposure region C1, a semiconductor region 6a in which each of the p-type impurity (e.g., boron (B)) and the n-type impurity (e.g., phosphorus (P) or arsenic (As)) is implanted is formed.

Subsequently, by wet etching using, e.g., an aqueous hydrofluoric acid (HF) solution or the like, the surface of the semiconductor substrate 1 is cleaned (washed). Then, over the surface (i.e., the surfaces of the p-type well 5 and the n-type well 6) of the semiconductor substrate 1, an insulating film 7a is formed. The insulating film 7a is comprised of, e.g., a thin silicon oxide film or the like, and can be formed by, e.g., a thermal oxidation method or the like.

Subsequently, over the semiconductor substrate 1, silicon film 8 such as a polysilicon film is formed as a conductor film for gate electrode formation. Of the silicon film 8, the region located in the n-channel MISFET formation region B1 to serve as the gate electrode 8a described later is changed into a low-resistance n-type semiconductor film (doped polysilicon film) by ion-implanting an n-type impurity such as phosphorus (P) or arsenic (As) therein using a photoresist film (not shown) as a mask. Also, of the silicon film 8, the region located in the p-channel MISEFT formation region Al to serve as a gate electrode 8b described later is changed into a low-resistance p-type semiconductor film (doped polysilicon film) by ion-implanting a p-type impurity such as boron (B) therein using another photoresist film (not shown) as a mask.

In the step of thus implanting impurities having different conductivity types into the n-channel MISFET formation region B1 and the p-channel MISFET formation region A1, into the portion of the silicon film 8 located exactly in the correction-mark projection exposure region C1, each of the n-type impurity and the p-type impurity is introduced. Thus, in the case of selectively introducing the different impurities into the n-channel MISFET formation region B1 and the p-channel MISFET formation region A1, each of the impurities is implanted into the correction-mark projection exposure region C1 since the automatic focus correction marks are provided over each of the reticles used in the steps of forming the plurality of photoresist films performed during the manufacturing steps of the semiconductor device.

Thereafter, a photoresist film PR2 is coated over the silicon film 8. Note that the silicon film 8, which is an amorphous film at the time of deposition, can also be changed into a polysilicon film by a heat treatment performed after the deposition thereof (after the ion implantation).

Figure 13:
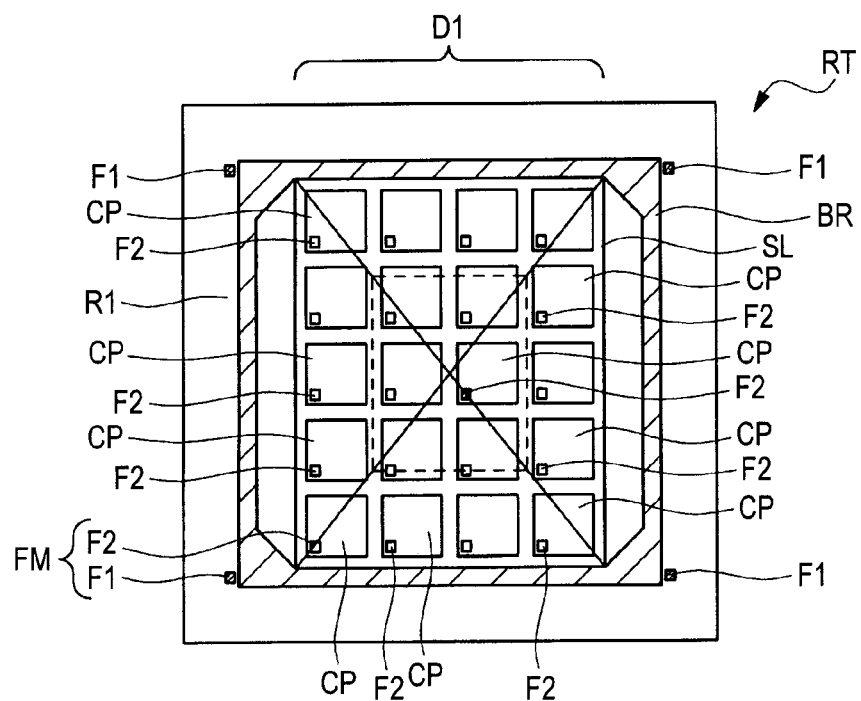
FIG. 13 is a plan view of a reticle used in the manufacturing steps of the semiconductor device as the first embodiment of the present invention.

Then, before the photoresist film PR2 is exposed, the automatic focus correction described using FIGS. 1 to 5 is performed. Here, a detailed description will be given to a method of the automatic focus correction using FIG. 13. FIG. 13 is a plan view showing the reticle used in the exposure step among the manufacturing steps of the semiconductor device of the first embodiment.

In the automatic focus correction when the semiconductor substrate is irradiated with the exposure light, as described using FIG. 1, the exposure light is applied from a light source in the exposure illumination system OS toward the reticle RT. The exposure light transmitted by the slit-like regions of the automatic focus correction marks FM provided over the surface of the reticle RT where the chromium pattern is not formed passes through the projection optical system OL to be applied to the reference mark BM over the upper surface of the wafer stage WS and to the light receiving element DT therein. At this time, the wafer stage WS is moved in the vertical direction, and the position of the wafer stage WS at which the exposure light detected by the light receiving element DT has a peak intensity serves as a position where the best focus is obtained when exposure is performed. By thus automatically measuring an optimal focal distance at which an image obtained by projecting the shape of each of the automatic focus correction marks FM is in focus, the focus correction is performed.

Note that, by one automatic focus correcting operation, only one of the plurality of automatic focus correction marks FM formed over the reticle RT can be brought into focus. That is, by one correcting operation, the best focus can be measured only in the limited region of the reticle RT where only one of the automatic focus correction marks FM is formed.

The automatic focus correction marks FM include the automatic focus correction marks F1 and F2 shown in FIG. 2. The automatic focus correction marks F1 have the same pattern shapes as those of the automatic focus correction marks F2 shown in FIG. 5. As shown in FIG. 2, at least one of the automatic focus correction marks F2 is provided in each of the plurality of chip patterns CP arranged in the actual device region D1. As described above, even if the focus correcting operation is performed by projecting one of the automatic focus correction marks FM, when another region in the reticle RT is projected, the projected image is out of focus and significantly blurred to cause defocusing.

When the focus correction is performed using only one of the automatic focus correction marks FM and then the pattern of the actual device region D1 is projected on the semiconductor substrate, defocusing occurs in the region other than the portion in which the focus correction is performed conceivably because, e.g., the projection lenses in the projection optical system OL shown in FIG. 1 are heated by the repeated exposure step to be partially deformed or have changes in the refractivities thereof, which may change the properties of the lens. In addition, the projection lenses in the projection exposure apparatus are not necessarily formed in ideal shapes, and may conceivably have partial distortion or the like before exposure is performed. Accordingly, the lenses may have refractivity properties which are different from one lens to another. Due to such factors, even when the best focus is detected using one of the automatic focus correction marks FM, in the region other than the region in the vicinity of the automatic focus correction mark FM of concern, the image projected using the exposure light may be out of focus to possibly cause defocusing. The isolation region 4 having a STI structure as shown in FIG. 11, the gate electrodes 8a and 8b described later using FIG. 15, or the like has a particularly small margin against a dimensional error, and therefore needs to be accurately formed.

Therefore, when automatic correction of the focus is performed, it is desirable to expose each one of all the automatic focus correction marks FM formed over the reticle RT and including the automatic focus correction marks F1 and F2, and project the pattern of each of the automatic focus correction marks FM on the light receiving element DT (see FIG. 1) to perform the automatic focus correction. By individually performing the focus correcting operation for each one of all the automatic focus correction marks FM formed over the reticle RT, when the chromium pattern in the reticle RT is projected, it is possible to bring the foci through the entire actual device region D1 closer to the best focus.

However, since the large number of automatic focus correction marks FM are provided over the reticle RT, if the automatic correcting operation is performed for each of all the automatic focus correction marks FM, time required for the automatic focus correcting operation increases to reduce the throughput of the manufacturing of the semiconductor device. Therefore, it is important to select some of the automatic focus correction marks FM in the reticle RT, and bring the projected image of the entire reticle RT into focus by smaller number of correcting operations.

A description will be given to the automatic focus correction marks FM used in the automatic focus correcting operation using FIG. 13. FIG. 13 is a plan view showing the same reticle RT as in FIG. 2. In the first embodiment, the automatic focus correcting operation is performed for the projected image of the entire reticle RT using the four automatic focus correction marks F1 formed over the reticle R1 and one of the automatic focus correction marks F2 formed in the center portion of the actual device region D1.

The four automatic focus correction marks F1 formed over the recto R1 indicate those respectively provided over the portions of the recto R1 located outside the both ends of the opposing two of the four sides forming the quadrilateral light blocking range BR surrounding the actual device region D1.

The automatic focus correction mark F2 in the center portion of the actual device region D1 indicates one of the automatic focus correction marks F2 formed in the plurality of respective chip patterns CP arranged in the matrix configuration over the actual device region D1 which is present in a rectangular range obtained by coupling the points on the respective diagonal lines of the rectangular actual device region D1 each at a distance corresponding to a quarter of the length of each of the diagonal lines from the center point of the actual device region D1 at which the diagonal lines thereof intersect. That is, when the actual device region Dl is assumed to be a rectangular region having the sides extending in the X-direction and the sides extending in the Y-direction, the center portion of the actual device region D1 is a rectangular region like the region enclosed by the broken line shown in FIG. 13, which has a center thereof located at the center point of the actual device region D1 at which the diagonal lines thereof intersect, has the sides each extending in the X-direction and having a length corresponding to half the length of each of the sides of the actual device region D1 extending in the same X-direction direction, and has the sides each extending in the Y-direction and having a length corresponding to half the length of each of the sides of the actual device region D1 extending in the same Y-direction. Thus, the center portion of the actual device region D1 is the rectangular region, and the diagonal lines thereof overlap the diagonal lines of the actual device region D1, and the length of each of the diagonal lines of the rectangular center portion of the actual device region D1 corresponds to half the length of each of the diagonal lines of the actual device region D1.

Here, it is assumed that the center portion of the actual device region D1 is synonymous to the center portion of the reticle RT, and the end portion of the actual device region D1, i.e., the end portion of the reticle RT refers to the region thereof located outside the center portion.

Note that, when, e.g., each of the projection lenses in the projection optical system OL (see FIG. 1) has a diameter of 31.11 mm, and each of the sides of the rectangular actual device region D1 has a length of about 22 mm or 26 mm, the foregoing points each at the distance corresponding to the quarter of each of the diagonal lines of the actual device region D1 are assumed to be points 4.5 mm apart from the center point of the actual device region D1, i.e., from the intersection of the diagonal lines of the actual device region D1 in directions along the diagonal lines. In FIGS. 2 and 13, only the automatic focus correction marks used for the automatic focus correction are hatched.

When one of the automatic focus correction marks F2 in the center portion of the actual device region D1 is selected and the correcting operation is performed, it is desirable to use the automatic focus correction mark F2 located at the position closest to the center point of the rectangular actual device region Dl at which the diagonal lines thereof intersect. This can bring the foci for the entire chip pattern projected on the semiconductor substrate closer to the best focus.

By thus projecting the patterns of the automatic focus correction marks FM at the plurality of locations over the reticle RT shown in FIG. 1 on the reference mark BM, the automatic focus correction is performed. That is, the automatic focus correction marks selected herein to be used for the automatic focus correction include the four automatic focus correction marks F1 and one of the automatic focus correction marks F2 located in the center portion of the actual device element D1 which are shown in FIG. 13, and the total number thereof is five. Thereafter, the wafer stage WS is moved in the X-direction and the Y-direction (in the front-rear and lateral directions), and the chromium pattern in the actual device region Dl (see FIGS. 2 and 13) is projected on the portion of the surface of the semiconductor substrate SB located at a predetermined position in the following manner to expose the photoresist film.

Figure 14:
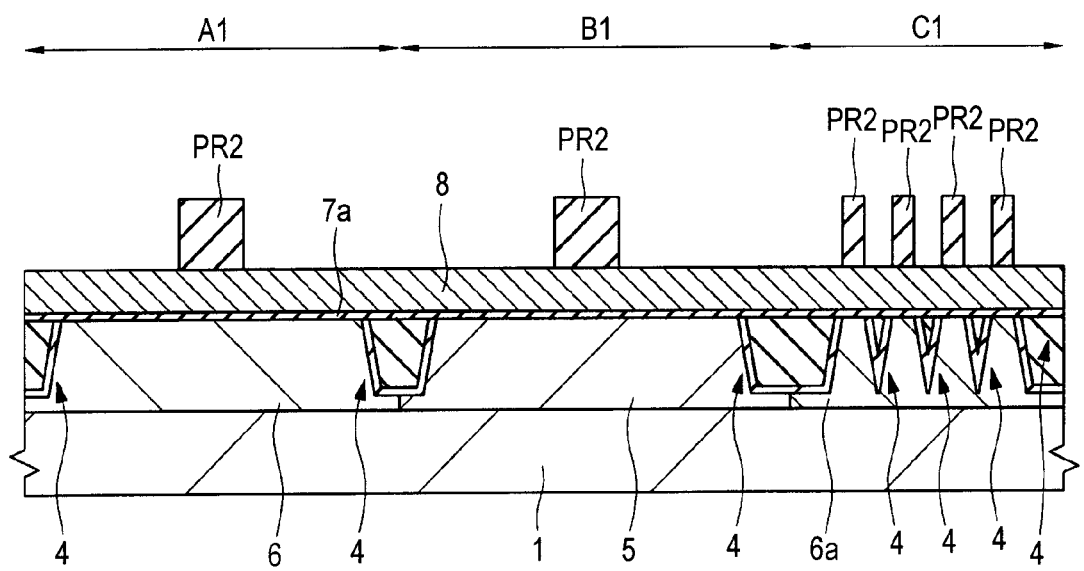
FIG. 14 is a cross-sectional view of the semiconductor device in the manufacturing step thereof subsequent to that of FIG. 12.

That is, as shown in FIG. 14, using the projection exposure apparatus shown in FIG. 1, the photoresist film PR2 is exposed. Thereafter, development is performed, and subsequently ashing using an oxygen plasma or the like is performed to remove the unneeded portion of the photoresist film PR2 and leave a photoresist pattern comprised of the photoresist film PR2 over the semiconductor substrate 1. At this time, in the correction-mark projection exposure region C1, the photoresist film PR2 in a striped shape corresponding to the shapes of the automatic focus correction marks remains over the silicon film 8.

Figure 15:
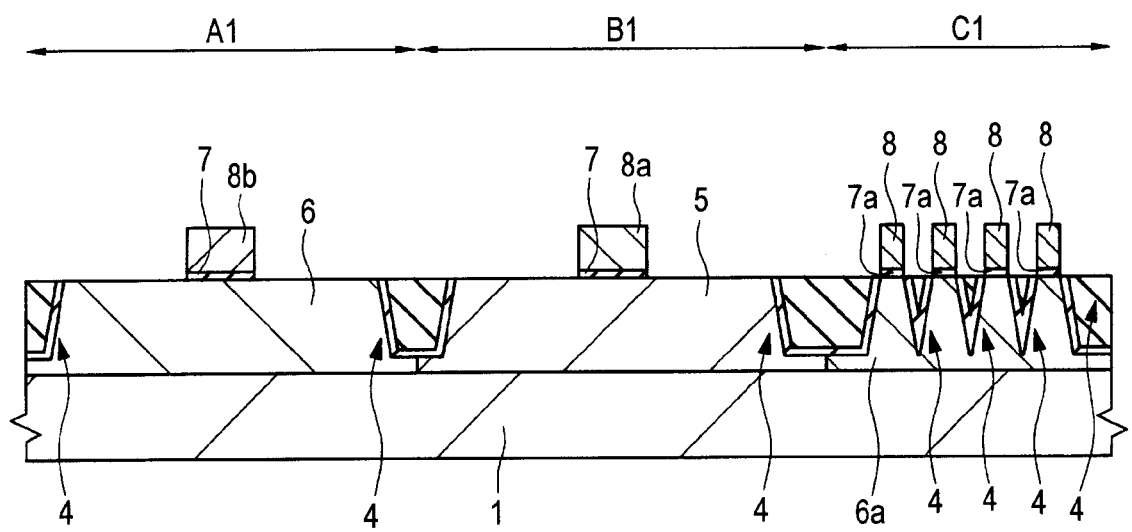
FIG. 15 is a cross-sectional view of the semiconductor device in the manufacturing step thereof subsequent to that of FIG. 14.

Next, as shown in FIG. 15, by a dry etching method using the photoresist film PR2 as a mask, the silicon film 8 is patterned to form the gate electrodes 8a and 8b.

The gate electrode 8a serving as the gate electrode of the n-channel MISFET is comprised of polysilicon (an n-type semiconductor film or doped polysilicon film) in which an n-type impurity has been introduced, and formed over the p-type well 5 via the gate insulating film 7 comprised of the insulating film 7a in the n-channel MISFET formation region B1. On the other hand, the gate electrode 8b serving as the gate electrode of the p-channel MISFET is comprised of polysilicon (a p-type semiconductor film or doped polysilicon film) in which a p-type impurity has been introduced, and formed over the n-type well 6 via the gate insulating film 7 comprised of the insulating film 7a in the p-channel MISFET formation region A1. The gate lengths of the gate electrodes 8a and 8b can be changed as necessary to, e.g., about 50 nm.

Here, the gate electrodes 8a and 8b are formed and, in the correction-mark projection exposure region C1, the silicon film 8 remains in the striped shape over the semiconductor region 6a via the insulating film 7a. That is, in the correction-mark projection exposure region C1, the same stacked structure as that of each of the gate electrodes 8a and 8b is formed. The silicon film 8a of each of the gate electrodes 8a and 8b and the insulating film 7a located thereunder are formed in a stacked pattern extending in one direction (e.g., the X-direction), and a plurality of the stacked patterns are arranged in a direction (e.g., the Y-direction) orthogonal to the extending direction of the silicon film 8. In the vicinity thereof, a plurality of stacked patterns extending in a direction (e.g., the Y-direction) different from the extending direction of the silicon film 8 described above are disposed to be arranged in the direction (e.g., the X-direction) orthogonal to the extending direction thereof. Note that the striped shape mentioned herein indicates the shape of each of the plurality of patterns extending in a direction along the main surface of the semiconductor substrate, and arranged in a direction orthogonal to the foregoing extending direction.

Figure 16:
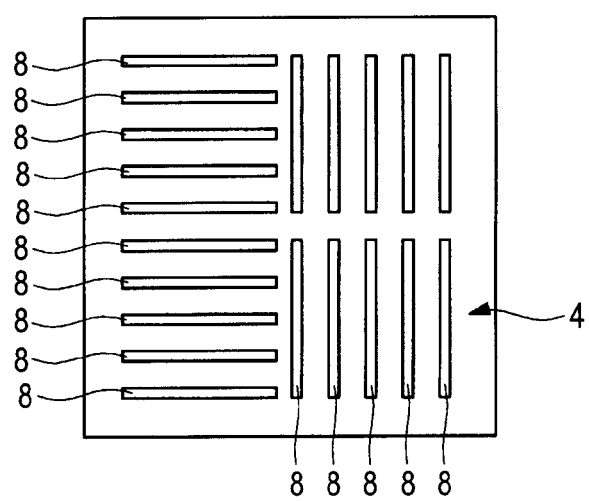
FIG. 16 is a plan view of the semiconductor device in the manufacturing step thereof subsequent to that of FIG. 14.

That is, when viewed in a plan view, patterns as shown in FIG. 16 are formed. The stacked patterns each including the silicon film 8 and the insulating film 7a are formed in a plan shape corresponding to the pattern of the slits of the automatic focus correction mark F2 shown in FIG. 5, and therefore form the plurality of patterns extending in the X-direction and arranged in the Y-direction and the plurality of patterns formed in vicinities thereof, extending in the Y-direction, and arranged in the X-direction, as shown in FIG. 16. FIG. 16 is a plan view showing the patterns of the silicon film 8 formed in the correction-mark projection exposure region C1 as a region in the upper surface of the semiconductor substrate on which the automatic focus correction mark F2 (see FIG. 5) is projected. As shown in FIG. 16, in the main surface of the semiconductor substrate around the patterns of the silicon film 8, the isolation region 4 is formed. Note that the film including the silicon film 8 formed in the correction-mark projection exposure region C1 shown in FIG. 14 is a structure which does not electrically function in the semiconductor device completed by the subsequent steps.

Figure 17:
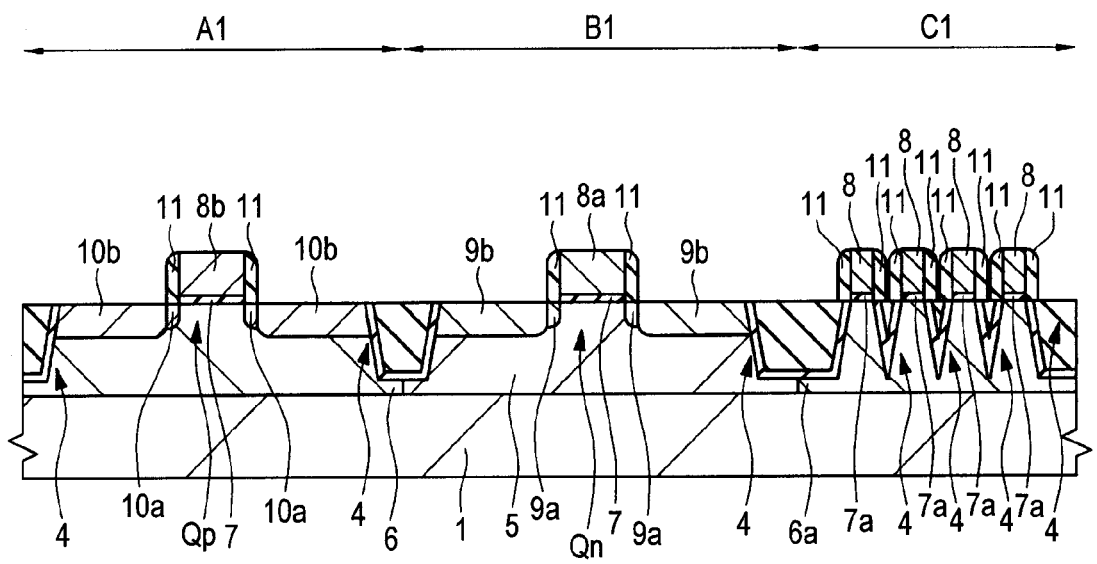
FIG. 17 is a cross-sectional view of the semiconductor device in the manufacturing step thereof subsequent to that of FIG. 15.
Figure 18:
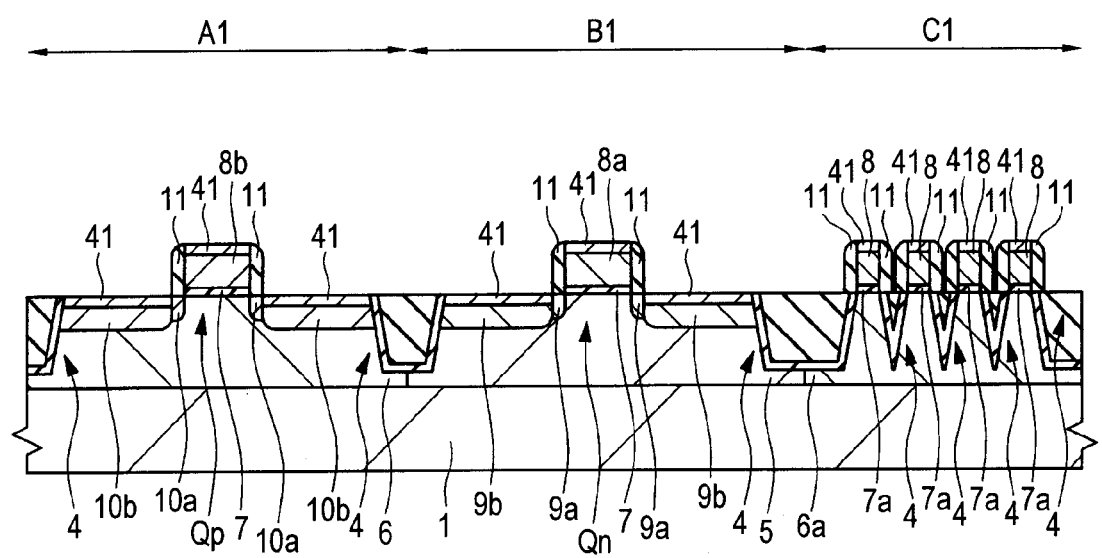
FIG. 18 is a cross-sectional view of the semiconductor device in the manufacturing step thereof subsequent to that of FIG. 16.

Next, as shown in FIG. 17, an n-type impurity such as phosphorus (P) or arsenic (As) is ion-implanted into the regions of the n-type well 5 located on both sides of the gate electrode 8a to thereby form (the pair of) n$^-$-type semiconductor regions 9a, while a p-type impurity such as boron (B) is ion-implanted into the regions of the n-type well 6 located on both sides of the gate electrode 8b to form (a pair of) p$^-$-type semiconductor regions 10a. The depths (junction depths) of the n$^-$-type semiconductor regions 9a and the p$^-$-type semiconductor regions 10a can be set to, e.g., about 30 nm.

Next, over the side walls of the gate electrodes 8a and 8b, sidewall spacers or sidewalls (sidewall insulating films) 11 each comprised of, e.g., a silicon oxide, a silicon nitride, or a laminate film of the insulating films are formed as insulating films. The sidewalls 11 can be formed by, depositing a silicon oxide film, a silicon nitride film, or a laminate film thereof over the semiconductor substrate 1 and anisotropically etching the silicon oxide film, the silicon nitride film, or the laminate film thereof by a RIE (Reactive Ion Etching) method or the like. The sidewalls 11 are patterns formed in the correction-mark projection exposure region C1, and are also formed over the side walls of the silicon film 8 having the same structure as that of each of the gate electrodes 8a and 8b.

After the formation of the sidewalls 11, (the pair of) n$^+$-type semiconductor regions 9b (source/drain regions) are formed by, e.g., implanting an n-type impurity such as phosphorus (P) or arsenic (A) into the regions of the p-type well 5 located on both sides of the gate electrode 8a and the sidewalls 11. For example, the n$^+$-type semiconductor regions 9b are formed by implanting phosphorus (P) at about $5 \times 10^{15}/m^2$ or arsenic (As) at about $4 \times 10^{15}/cm^2$. On the other hand, (a pair of) p$^+$-type semiconductor regions 10b (source/drain regions) are formed by, e.g., implanting a p-type impurity such as boron (B) into the regions of the n-type well 6 located on both sides of the gate electrode 8b and the sidewalls 11. For example, the p$^+$-type semiconductor regions 10b are formed by implanting boron (B) at about $4 \times 10^{15}/cm^2$. Either the n$^+$-type semiconductor regions 9b or the p$^+$-type semiconductor regions 10b may be formed first. After the ion implantation, an annealing treatment for activating the introduced impurities can also be performed by, e.g., a heat treatment (spike annealing treatment at about 1050° C. for about 5 seconds. The depths (junction depths) of the n$^+$-type semiconductor regions 9b and the p$^+$-type semiconductor regions 10b can be set to, e.g., about 80 nm.

When the n$^+$-type semiconductor regions 9b are formed, the ion implantation is performed in a state where a photoresist film covering the p-channel MISFET formation region A1 is formed. When the p$^+$-type semiconductor regions 10b are formed, the ion implantation is performed in a state where a photoresist film covering the n-channel MISFET formation region B1 is formed. In either of the steps, before the photoresist film is formed, the automatic focus correction described using FIG. 13 or the like is performed. Note that, in the ion implantation steps for forming the n$^+$-type semiconductor regions 9b and the p$^+$-type semiconductor regions 10b, even when substantially the entire correction-mark projection exposure region C1 is covered with the photoresist films, since the chromium pattern of each of the automatic focus correction marks F2 in the reticle is formed with the pattern with the slit-like openings used for focus correction as shown in FIG. 5, the photoresist film is not formed immediately over the silicon film 8 shown in FIG. 17. Accordingly, the impurities implanted in the ion implantation steps for forming the n$^+$-type semiconductor regions 9b and the p$^+$-type semiconductor regions 10b are each implanted also into the silicon film 8.

The n$^+$-type semiconductor regions 9b have impurity concentrations higher than those of the n$^-$-type semiconductor regions 9a, while the p$^+$-type semiconductor regions 10b have impurity concentrations higher than those of the p$^-$-type semiconductor regions 10a. Consequently, n-type semiconductor regions (impurity diffusion layers) functioning as the source/drain of the n-channel MISFET are formed of the n$^+$-type semiconductor regions (impurity diffusion layers) 9b and the n$^-$-type semiconductor regions 9a, while p-type semiconductor regions (impurity diffusion layers) functioning as the source/drain of the p-channel MISFET are formed of the p$^+$-type semiconductor regions (impurity diffusion layers) 10b and the p$^-$-type semiconductor regions 10a. Accordingly, the source/drain regions of the n-channel MISFET and the p-channel MISFET have LDD (Lightly doped Drain) structures. The n⁻-type semiconductor regions 9a are formed by self alignment with respect to the gate electrode 8a, while the n⁺-type semiconductor regions 9b are formed by self alignment with respect to the sidewalls 11 formed over the side walls of the gate electrode 8a. The p⁻-type semiconductor regions 10a are formed by self alignment with respect to the gate electrode 8b, while the p⁺-type semiconductor regions 10b are formed by self alignment with respect to the sidewalls 11 formed over the side walls of the gate electrode 8b.

Thus, in the p-type well 5, the n-channel MISFET Qn is formed as a field effect transistor while, in the n-type well 6, the p-channel MISFET Qp is formed as a field effect transistor. In this manner, the structure of FIG. 9 is obtained. The re-channel MISFET Qn can be regarded as an n-channel field effect transistor, and the p-channel MISFET Qp can be regarded as a p-channel field effect transistor. Also, the n⁺-type semiconductor regions 9b can be regarded as the source/drain semiconductor regions of the n-channel MISFET Qn, and the p⁺-type semiconductor regions 10b can be regarded as the source/drain semiconductor regions of the p-channel MISFET Qp.

Next, by a salicide (Self Aligned Silicide) technique, a low-resistance metal silicide layer (corresponding to a metal silicide layer 41 described later) is formed in each of the surfaces of the gate electrode 8a and source/drain regions (which are the n⁺-type semiconductor regions 9b herein) of the n-channel MISFET On and the surfaces of the gate electrode 8b and source/drain regions (which are the p⁺-type semiconductor regions 10b herein) of the p-channel MISFET Qp.

In the step of forming the silicide layer, a metal film is first formed (deposited) using, e.g., a sputtering method over the main surface (entire surface) of the semiconductor substrate 1 including the upper surfaces of the gate electrodes 8a and 8b, the silicon film 8, the n⁺-type semiconductor regions 9b, and the p⁺-type semiconductor regions 10b. A metal film 12 is assumed to be comprised of, e.g., a Ni-Pt (nickel-platinum) alloy film (an alloy film of Ni and Pt). Thereafter, the semiconductor substrate 1 is subjected to a first heat treatment (1st annealing treatment) at a temperature of 250° C. to 300° C. Subsequently, a wet cleaning treatment is performed to remove an unreacted portion of the metal film, and then the semiconductor substrate 1 is subjected to a second heat treatment (2nd annealing treatment). The second heat treatment is performed at a heat treatment temperature which is substantially the same as the heat treatment temperature in the first heat treatment described above or higher than the first heat treatment temperature.

In this manner, the metal silicide layer 41 mainly containing NiSi (nickel silicide) is formed in the respective upper portions of the gate electrodes 8a and 8b, the n⁺-type semiconductor regions 9b, and the p⁺-type semiconductor regions 10b. Note that, in the step of forming the metal silicide layer 41, in the same manner as in the respective upper surfaces of the gate electrodes 8a and 8b, the metal silicide layer 41 is formed also in the upper surface of the silicon film 8 in the correction-mark projection exposure region C1.

Figure 19:
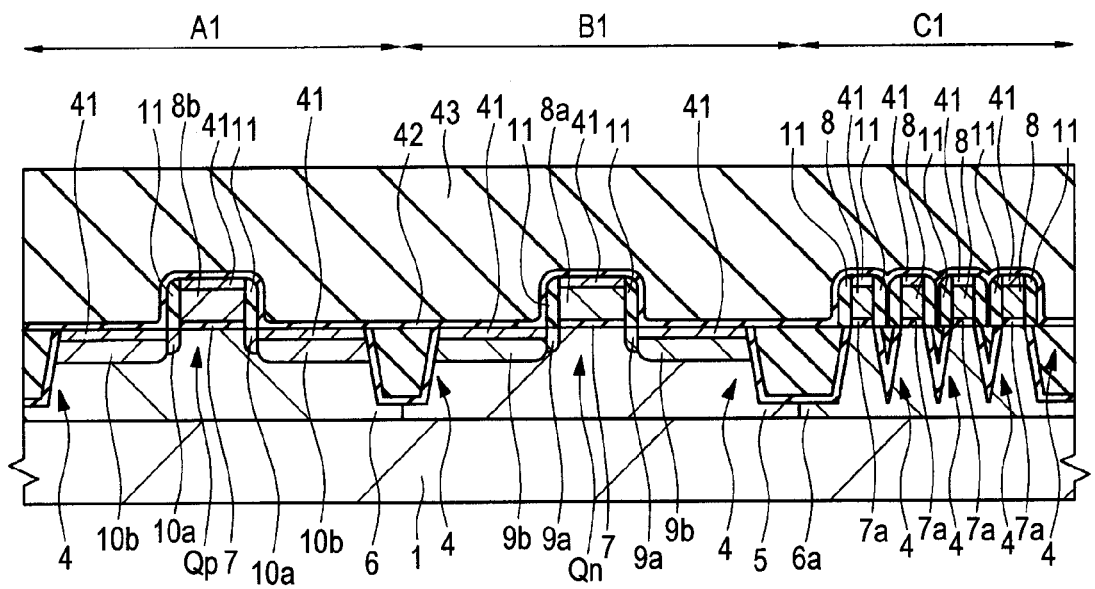
FIG. 19 is a cross-sectional view of the semiconductor device in the manufacturing step thereof subsequent to that of FIG. 18.

Next, as shown in FIG. 19, over the main surface of the semiconductor substrate 1, an insulating film 42 is formed. That is, the insulating film 42 is formed over the semiconductor substrate 1 including the metal silicide layer 41 so as to cover the gate electrodes 8a and 8b and the silicon film 8. The insulating film 42 is comprised of, e.g., a silicon nitride film, and can be formed by a plasma CVD method in which a deposition temperature (substrate temperature) is about 450° C. or the like. Subsequently, over the insulating film 42, an insulating film 43 thicker than the insulating film 42 is formed. The insulating film 43 is comprised of, e.g., a silicon oxide film or the like, and can be formed using TEOS by a plasma CVD method in which a deposition temperature is about 450° C. or the like. As a result, an interlayer insulating film comprised of the insulating films 42 and 43 is formed. Thereafter, the upper surface of the insulating film 43 is subjected to polishing by a CMP method or the like to be planarized. Even if the surface of the insulating film 42 is formed in an indented shape due to an underlying level difference, by polishing the surface of the insulating film 43 by the CMP method, the interlayer insulating film having the planarized surface can be obtained.

Figure 20:
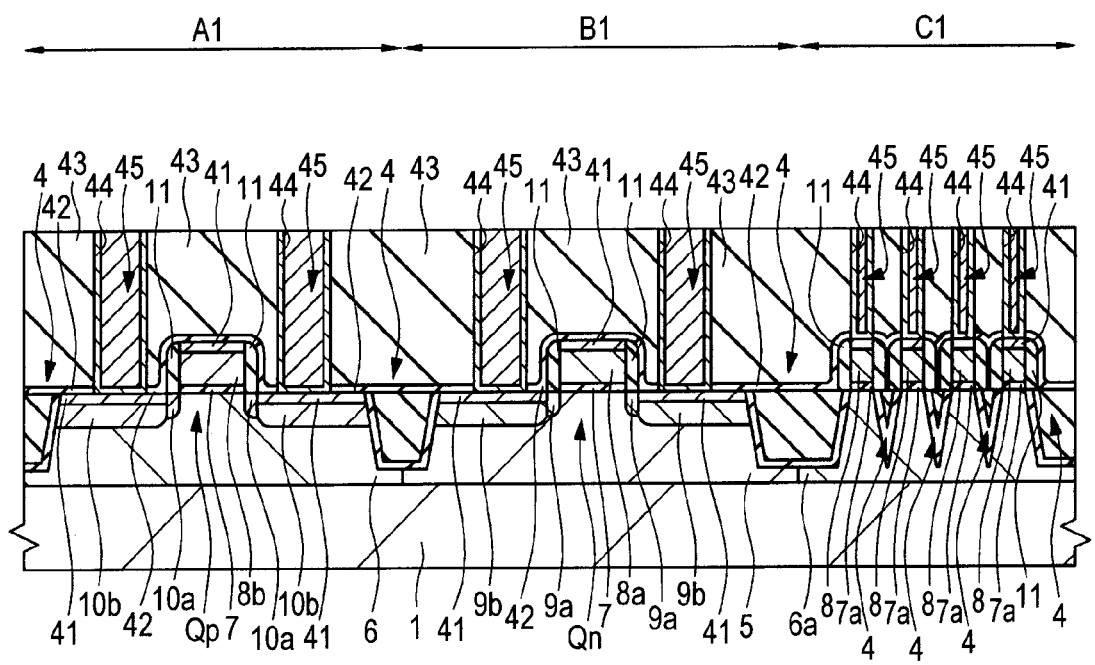
FIG. 20 is a cross-sectional view of the semiconductor device in the manufacturing step thereof subsequent to that of FIG. 19.

Next, as shown in FIG. 20, using a photoresist pattern (not shown) formed over the insulating film 43 as an etching mask, the insulating films 43 and 42 are subjected to dry etching to be formed with contact holes (through holes or holes) 44. At this time, under conditions under which the insulating film 43 is more likely to be etched than the insulating film 42, dry etching of the insulating film 43 is performed first to cause the insulating film 42 to function as an etching stopper film, and thereby form the contact holes 44 in the insulating film 43. Then, under conditions under which the insulating film 42 is more likely to be etched than the insulating film 43, the insulating film 42 at the bottom portions of the contact holes 44 is subjected to dry etching to be removed. At the bottom portions of the contact holes 44, parts of the main surface of the semiconductor substrate 1, e.g., parts of the metal silicide layer 41 over each of the surfaces of the n⁺-type semiconductor regions 9b, the p⁺-type semiconductor regions 10b, the gate electrodes 8a and 8b, and the silicon films 8 are exposed.

In the same step, the insulating films 42 and 43 in the correction-mark projection exposure region C1 are processed by etching to form the contact holes 44, and thereby expose the metal silicide layer 41 over the upper surface of the silicon film 8. Before the foregoing photoresist pattern is formed also, the automatic focus correction described using FIG. 13 is performed.

Next, in the contact holes 44, plugs (connection conductor portions, buried plugs, or buried conductor portions) 45 comprised of tungsten (W) or the like are formed. To form the plugs 45, e.g., over the insulating film 43 including the insides (bottom portions and side walls) of the contact holes 44, a barrier conductor film 45a (e.g., a titanium film, a titanium nitride film, or a laminate film thereof) is formed by a plasma CVD method in which a deposition temperature (substrate temperature) is about 450° C. Subsequently, a main conductor film 45b comprised of a tungsten film or the like is formed over the barrier conductor film 45a by a CVD method or the like so as to fill the contact holes 44 and, by removing the unneeded portions of the main conductor film 45b and the barrier conductor film 45a which are located over the insulating film 43 by a CMP method, an etch-back method, or the like, the plugs 45 can be formed in the contact holes 44.

The plugs 45 formed over the gate electrodes 8a and 8b, the n⁺-type semiconductor regions 9b, or the p⁺-type semiconductor regions 10b come in contact with the metal silicide layer 41 over each of the surfaces of the gate electrodes 8a and 8b, the n⁺-type semiconductor regions 9b, or the p⁺-type semiconductor regions 10b at the bottom portions thereof to be electrically coupled thereto. On the other hand, the plugs 45 formed over the silicon films 8 come in contact with the metal silicide layer 41 over each of the surfaces of the silicon films 8 at the bottom portions thereof to be electrically coupled to the silicon films 8.

Figure 21:
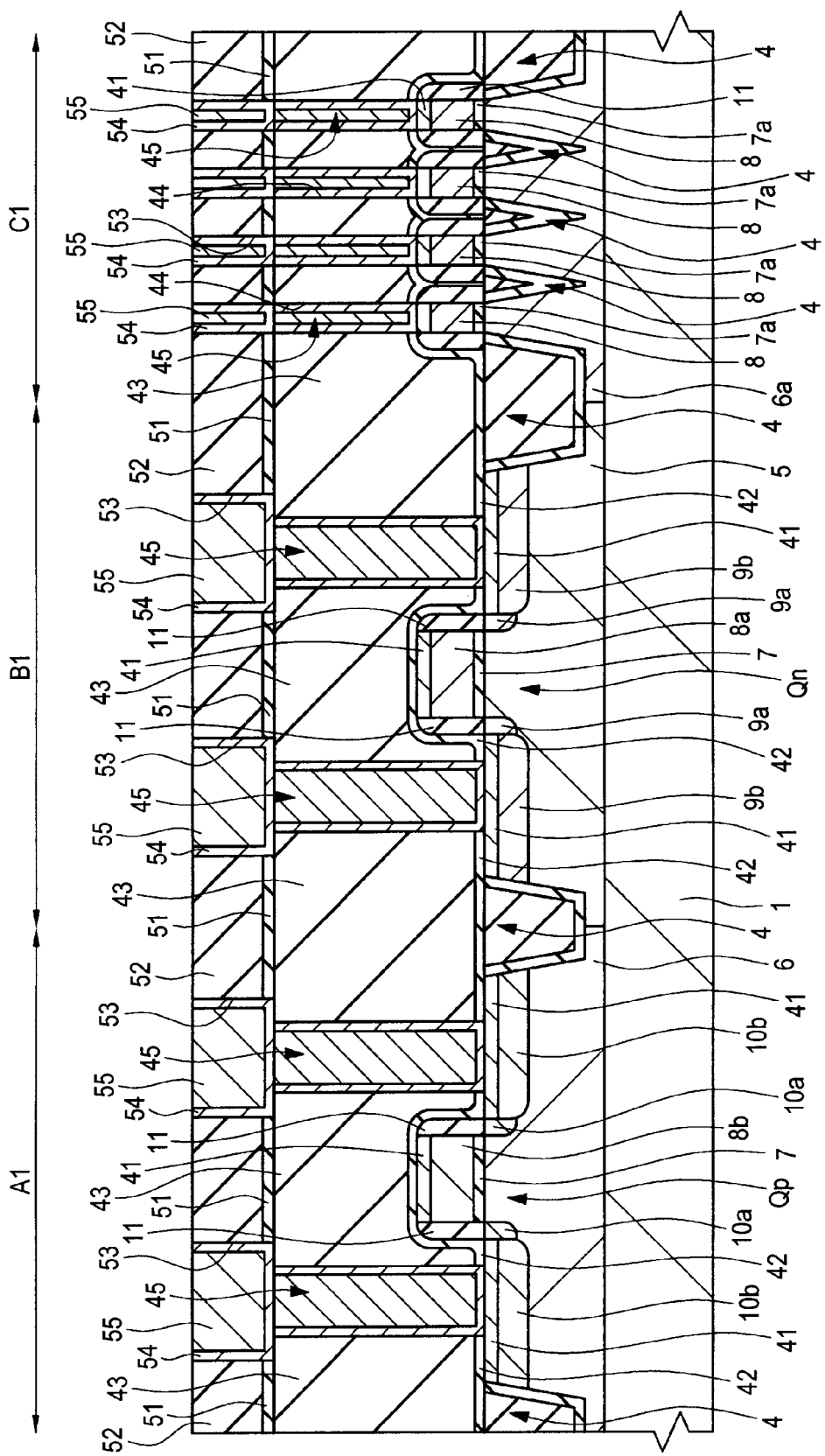
FIG. 21 is a cross-sectional view of the semiconductor device in the manufacturing step thereof subsequent to that of FIG. 20.

Next, as shown in FIG. 21, over the insulating film 43 in which the plugs 45 are buried, a stopper insulating film 51 and an insulating film 52 for wiring formation are successively formed. The stopper insulating film 51 serves as an etching stopper when the insulating film 52 is subjected to trench processing, and uses a material having an etching selectivity to the insulating film 52. The stopper insulating film 51 can be comprised of, e.g., a silicon nitride film formed by a plasma CVD method, and the insulating film 52 can be formed of, e.g., a silicon oxide film formed by a plasma CVD method. Note that, in the stopper insulating film 51 and the insulating film 52, first-layer wiring lines described next are formed.

Next, the first-layer wiring lines are formed by a single damascene method. First, by dry etching using a photoresist pattern (not shown) as a mask, wiring trenches 53 are formed in the predetermined regions of the insulating film 52 and the stopper insulating film 51. Then, over the main surface (i.e., over the insulating film 52 including the bottom portions and side walls of the wiring trenches), a barrier conductor film (barrier metal film) 54 is formed. As the barrier conductor film 54, e.g., a titanium nitride film, a tantalum film, a tantalum nitride film, or the like can be used. Subsequently, by a CVD method, a sputtering method, or the like, a seed layer of copper is formed over the barrier conductor film 54 and, using an electrolytic plating method or the like, a copper plating film is formed over the seed layer. With the copper plating film, the wiring trenches 53 are filled.

Then, the copper plating film, the seed layer, and the barrier conductor film 54 are removed by a CMP method from the region other than the wiring trenches 53 to form first-layer wiring lines 55 containing copper as a main conductive material. The wiring lines 55 are electrically coupled to the source/drain $n^+$-type semiconductor regions 9b and the source/drain $p^+$-type semiconductor regions 10b of the n-channel MISFET Qn and the p-channel MISFET Qp, the gate electrodes 8a and 8b thereof, and the like via the plugs 45.

By the step, in the correction-mark projection exposure region C1, the first-layer wiring lines 55 having widths equal to those of the plugs 45 are formed over the plugs 45. Note that the silicon films 8 and the plugs 45 and the first-layer wiring lines 55 which are electrically coupled to the silicon films 8 are structures formed because of the automatic focus correction marks F2 present in the respective chip patterns CP of the reticle RT shown in FIG. 13, and are conductors which do not electrically function in the completed semiconductor device.

Thereafter, upper-layer wiring lines such as second-layer wiring lines are formed by a dual damascene method, but the illustration and description thereof are omitted herein. After stacked wiring lines are formed over the first-layer wiring lines 55, the uppermost-layer wiring lines are partly exposed to form pad portions used as electrodes. Subsequently, the semiconductor substrate 1 is cut along the scribe lines to be singulated to form the plurality of semiconductor chips formed in the respective regions corresponding to the chip patterns CP shown in FIG. 13. In this manner, the semiconductor devices of the first embodiment are completed.

Over the substrate of each of the completed semiconductor chips, a film which is a striped structure having a shape corresponding to the automatic focus correction marks, and does not electrically function as shown in the correction-mark projection exposure region C1 of FIG. 21 is formed. If there is no automatic focus correction mark in the chip patterns CP of the reticle RT, a striped structure as shown in the correction-mark projection exposure region C1 of FIG. 21 is not formed in the completed semiconductor device. Note that, as described above, the insulating film 7a, the silicon films 8, the plugs 45, and the wiring lines 55 which have substantially the same widths are formed in stacked relation over the semiconductor region 6a into shapes corresponding to the slit shapes of the automatic focus correction marks only when reticles used in the manufacturing steps of the semiconductor device have the automatic focus correction marks at the same positions. That is, when the positions of the automatic focus correction marks are different from one reticle to another, the silicon film 8 may be formed immediately over the isolation region 4 via the insulating film 7a, or the plugs 45 may not be formed over the silicon films 8.

Next, the effect of the first embodiment will be described in greater detail. As described using FIGS. 1 to 5, when the chromium pattern formed over the reticle is projected on the semiconductor substrate, the automatic focus correction is performed for the purpose of preventing the occurrence of defocusing. Even when the projected image of the pattern over one of the regions of the reticle is in focus as a result of performing the automatic focus correction once, the patterns over the other regions of the reticle may not be out of focus. This is because, as described above, due to partial deformation of any of the projection lenses in the projection optical system OL shown in FIG. 1 or a change in the refractivity thereof, the properties of the projection lens may not be uniform therein.

Also, even when the automatic focus correction before exposure is performed is performed for the plurality of automatic focus correction marks over the reticle, and projected image of the entire reticle can be formed at an optimal focal distance, while a large number of semiconductor substrates are subjected to an exposure treatment thereafter, any of the projection lenses may be heated by the exposure light to be partly deformed thereby, and possibly cause defocusing. Each of the projection lenses is thicker in the center portion thereof and thinner in the end portion (peripheral edge portion) thereof, and the center portion is more frequently exposed to the exposure light than the end portion. Accordingly, the end portion of the projection lens is less frequently exposed to the exposure light than the center portion thereof, and has a heat release property higher than that of the center portion thereof so that the center portion reaches a high temperature. In other words, while the center portion of the projection lens is more likely to be heated and deformed due to the repeated exposure treatment, the end portion of the projection lens is less likely to be heated even when the exposure treatment is repeated and therefore has reduced deformation. Accordingly, as a result of performing the exposure treatment a plurality of times, a relative change is observed between the properties of the end portion of the projection lens and those of the center portion thereof.

In the case of using an i-line (at a wavelength of 365 nm) as the light source of the exposure light, the use of glass for the member of the projection lens is considered. Also, in the case of using a KrF (krypton fluoride) line (at a wavelength of 248 nm) as the light source of the exposure light, the use of quartz for the member of the projection lens is considered while, in the case of using an ArF (argon fluoride) line (at a wavelength of 193 nm) as the light source of the exposure light, the use of fluorite for the member of the projection lens is considered. For the member of the projection lens described above, a material is used in accordance with the wavelength of the exposure light which easily transmits light having the foregoing wavelength. Note that the i-line is light using a mercury lamp as the light source. At this time, quartz is relatively low in heat absorption, and is less likely to reach a high temperature even in the center portion of the projection lens. However, since the projection lens comprised of glass is high in heat absorption and fluorite is higher in heat absorption than glass, an increase in the temperature thereof due to the exposure treatment is remarkable.

When a reticle is used in which the ratio of the area occupied by the chromium pattern to the size of one surface of the reticle formed with the chromium pattern is low, since the region in which the exposure light is blocked by the chromium pattern is small, each of the projection lenses tends to reach a high temperature. Otherwise, when the exposure step in which the time of irradiation with the exposure light is long and an amount of exposure in one shot of exposure is large is performed, a larger amount of heat is accumulated in the projection lens than in the case where the time of irradiation with the exposure light is relatively short so that the deformation of the projection lens is significant.

Figure 31:
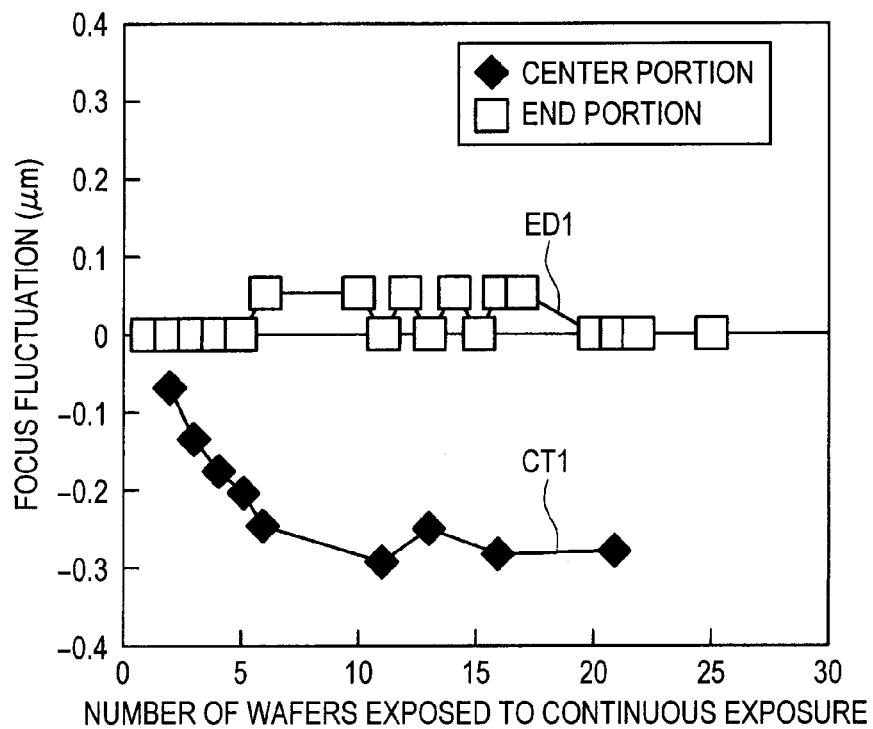
FIG. 31 shows graphs each representing a relationship between the number of exposures and a variation in focus value.

FIG. 31 shows graphs each representing a variation in focus value when a plurality of semiconductor substrates (semiconductor wafers) are exposed. In FIG. 31, the ordinate axis represents a value showing the magnitude of a deviation (variation) in focus value, and the abscissa axis represents the number of exposed semiconductor wafers. That is, a measurement value located more rightward in the graphs shows a focus value when a larger number, of exposure steps are performed. FIG. 31 shows a graph CT1 obtained by measuring focus values at the center of a projection lens, and a graph ED1 obtained by measuring focus values in portions on which the patterns of the automatic focus correction marks F1 (see FIG. 2) over the surface of the reticle are projected through the end portion of the projection lens. Here, each of the graphs is based on the focus value when the first semiconductor wafer is exposed, which is set to zero. Note that a variation in focus value shows a variation in focal image height. Ideally, there is no image height difference (difference in focus value) and no variation therein in the projection lens.

In the graph ED1 shown in FIG. 31, even when twenty or more semiconductor wafers are exposed, the focus value holds a value close to 0 since automatic focus correction has been performed for each of the exposure steps. This is because, by the automatic focus correction, the wafer stage is moved to adjust the focus before each of the exposure steps and, since the end portion of the projection lens by which the exposure light having passed through the pattern of the automatic focus correction marks F1 (see FIG. 2) is transmitted is the region of the projection lens which is less likely to be heated, even if exposure is repeatedly performed, a change in focus value due to a heat history is small. Note that, here, an amount of heat represented by the product of a temperature and a time is called the heat history. The projection lens has the property of being deformed or changing in refractivity to vary the focus when the heat history increases and a high temperature is reached.

By contrast, in the graph CT1, every time the number of the exposed wafers increases to increase the number of shots of exposure, the focus value varies and, when a given number of the exposed wafers is exceeded, changes in focus value decrease so that a substantially uniform focus value is maintained. This is because the graph CT1 results from the measurement of the focus values of projected images each passing through the center portion of the projection lens, and the center portion of the projection lens is high in heat absorption and more likely to undergo a change in focus value due to deformation or a refractivity change. The reason why the focus value in the graph CT1 remains substantially constant from a middle point is that heat applied to the projection lens by exposure and heat released therefrom are balanced, and therefore the heat of the projection lens does not increase any longer.

The portions in which measurement for the graph CT1 is performed is in the actual device region which is actually used as a product, and the result of measuring the focus values in the portions on which the pattern of the center portion of the reticle is projected is shown. Here, for the graph CT1, the focus correction using the automatic focus correction marks as performed for the graph ED1 has not been performed, and changes in focus value have not been corrected so that the focus value has significantly varied. When the focus value has significantly varied from 0 as a reference value to a value having an absolute value of more than 0.2 µm, the phenomenon of defocusing becomes conspicuous to significantly degrade the reliability of the semiconductor device. In the graph CT1, at the time when the number of the semiconductor wafers subjected to the exposure treatment exceeds five, the variation in focus value exceeds 0.2 µm so that defocusing occurs.

Changes in focus value in the center portion of the projection lens that has been heated by thus performing repeated exposure cannot be ignored. Otherwise, when a focus correcting operation is performed using only the automatic focus correction mark formed in the end portion (e.g., recto) of the reticle, even if the exposure light through the end portion of the reticle where a focus change due to heat barely occurs can be converged at the base focus, it is impossible to detect whether or not the exposure light passing through the center portion of the reticle where a focus change due to heat is significant has undergone a shift in focus, and therefore automatic correction cannot be performed for the center portion.

Accordingly, a method can be considered in which the arrangement of the automatic focus correction marks provided over the reticle is such that the automatic focus correction marks are provided only over the recto of the reticle, and automatic focus correction is performed using only the automatic focus correction marks formed outside the actual device region. In this case, however, it is difficult to correct the focus in the actual device region of the reticle which is projected through the center portion of the projection lens where the focus is likely to be changed by heat.

By contrast, in the reticle RT shown in FIG. 13, not only the automatic focus correction marks F1 provided over the recto of the reticle RT, but also the at least one automatic focus correction mark F2 is provided in each of the chip patterns CP arranged over the actual device region D1 of the reticle RT. In the manufacturing steps of the semiconductor device of the first embodiment, the use of the automatic focus correction mark F2 in the center portion of the actual device region D1 for the automatic focus correcting operation allows correction of the focus of the exposure light projected through the center portion of the projection lens where a shape change is likely to occur due to the heat history resulting from repeated exposure. By thus preventing the occurrence of defocusing, it is possible to form a pattern in a desired shape and at a desired position using a photolithographic technique. Therefore, the reliability of the semiconductor device can be improved.

When focus correction is actually performed, automatic correction is performed using the four automatic focus correction marks F1 formed on the recto and one of the automatic focus correction marks F2 in the center portion of the actual device region D1. When a projection lens having properties as shown in FIG. 31 is used, correction is performed such that, to bring the focus of an image projected through the center portion of the projection lens to the best focus, the wafer stage is moved to move the focus value of the graph CT1 into the positive (plus) range.

Figure 22:
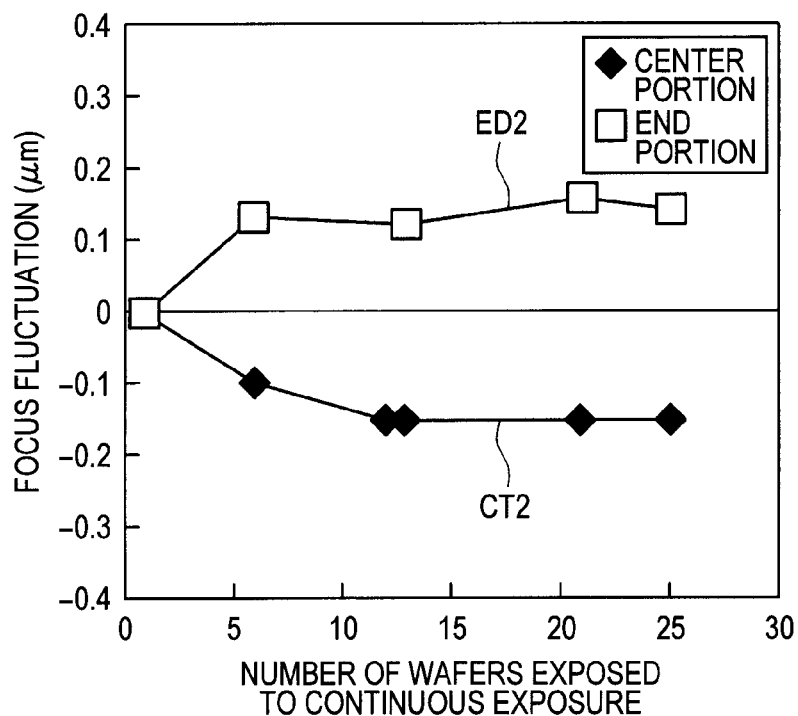
FIG. 22 shows graphs each representing a relationship between the number of exposures and a variation in focus value.

At this time, the focus value of the graph ED1 also varies to be larger in the positive range. That is, when aberration has occurred between the end portion of the projection lens and the center portion thereof due to a heat history or the like, it is impossible in the apparatus to vary the focus value of the exposure light through the middle portion of the projection lens without varying the focus value of the exposure light through the end portion of the projection lens. Accordingly, as shown in FIG. 22, focus correction is performed herein such that the respective absolute values of the graph ED2 showing variations in the focus value of the exposure light that has been projected through the end portion of the reticle and the graph CT2 showing variations in the focus value of the exposure light that has been projected through the middle portion of the reticle are less than 0.2.

That is, focus correction is performed such that the respective absolute values of the focus value of the exposure light having passed through the middle portion of the projection lens and the focus value of the exposure light having passed through the end portion of the projection lens are substantially equal. As a result, in contrast to the case where focus correction is performed using only the automatic focus correction marks formed in the end portion of the reticle, it is possible to reduce variations in the focus of the exposure light projected through the middle portion of the projection lens and prevent defocusing from occurring in the region of the semiconductor substrate in which the semiconductor chips serving as a product region are formed. Note that FIG. 22 shows two graphs each representing a relationship between a variation in focus value and the number of exposed semiconductor wafers, similarly to FIG. 31, which are a graph ED2 showing the focus value of exposure light projected through the end portion of the projection lens and a graph CT2 showing the focus value of exposure light projected through the center portion of the projection lens.

As described above, the center portion and the end portion of the projection lens have different degrees of influence on a heat load and different variations in focus. Accordingly, even when focus correction is performed using only the automatic focus correction marks in the end portion (recto) of the reticle, automatic correction of the focus through the center portion of the projection lens is not correctly performed, and the problem of the occurrence of defocusing in the actual device region arises. By contrast, in the method of manufacturing the semiconductor device of the first embodiment, the automatic focus correction marks are formed in the individual chip patterns over the actual device region of the reticle, and focus correction is performed using one of the automatic focus correction marks located in the center portion of the actual device region, thereby allowing prevention of the occurrence of defocusing in the center portion of the exposure region. In this manner, it is possible to prevent a dimensional error in a wiring line or the like and the displacement thereof, and improve the reliability of the semiconductor device.

Apart from the case where the center portion and the end portion of the projection lens have different variations in focus due to their different degrees of influence on a heat load, there is a case where the center portion and the end portion of the projection lens originally have a focus difference therebetween. This may conceivably include a case where, even projection lenses manufactured according to the same specifications have aberration properties different from one another, a case where the center portion and the end portion of the projection lens have different foci due to aging degradation, and the like.

Figure 23:
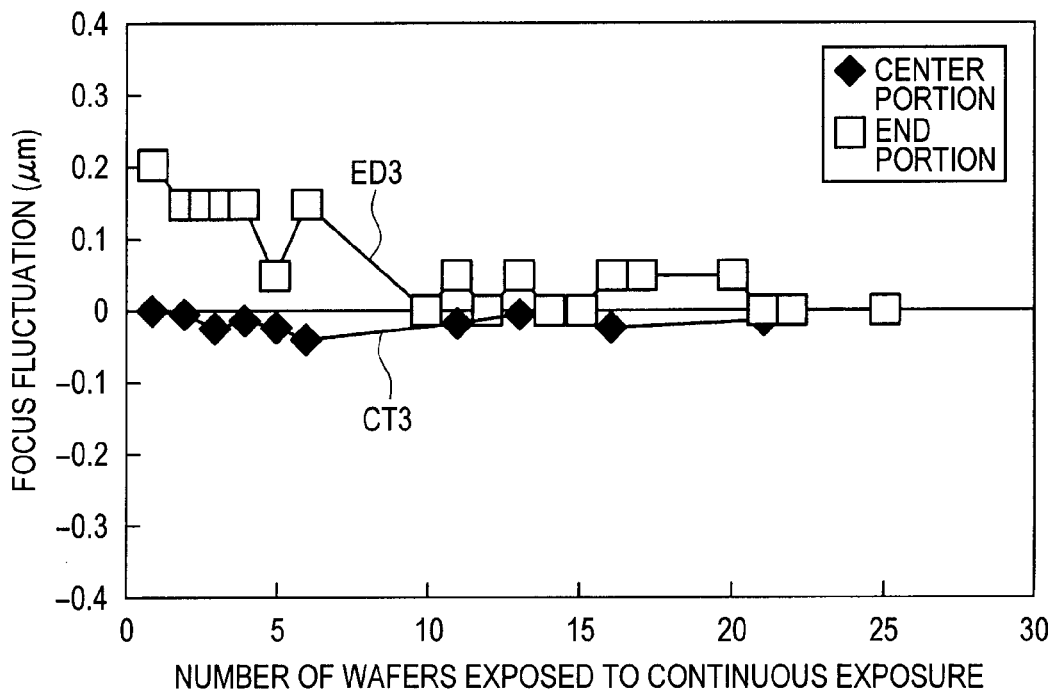
FIG. 23 shows graphs each representing a relationship between the number of exposures and a variation in focus value.

As shown in FIGS. 31 and 22, the projection lens has the property of, as a result of being used for exposure and heated, varying the focus value in a predetermined direction (in the negative (minus) direction of the focus value shown in FIGS. 31 and 22). With the projection lens having aberration and the possibility of causing a focus difference between exposure light passing through the center portion thereof and exposure light passing through the end portion thereof before exposure is performed, at first exposure (at the time of exposing the first semiconductor wafer), as shown in FIG. 23, the graph CT3 of the focus value of exposure light passing through the center portion of the projection lens may be displaced in the positive (plus) direction from the graph ED3 of the focus value of exposure light passing through the end portion thereof. Note that FIG. 23 shows two graphs each representing a relationship between a variation in focus value and the number of exposed wafers, similarly to FIG. 22, which are a graph ED3 representing the focus value of the exposure light projected through the end portion of the projection lens and a graph CT3 representing the focus value of the exposure light projected through the center portion of the projection lens.

When exposure is performed using such a projection lens, a focus characteristic closer to an ideal state can be obtained in which the center portion of the projection lens reaches a high temperature to thereby bring the focus value of the graph CT3 closer to the focus value of the graph ED3, and the focus difference between the exposure light passing through the center portion of the projection lens and the exposure light passing through the end portion thereof decreases to thereby allow the whole projection lens to provide a uniform focus value.

Figure 24:
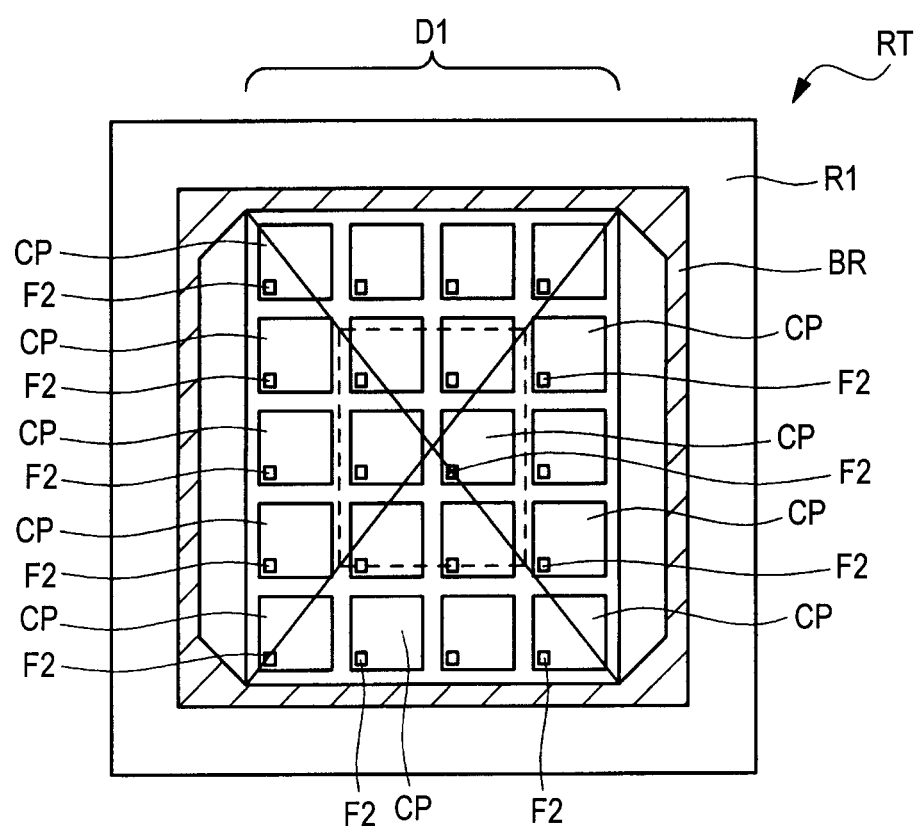
FIG. 24 is a plan view showing a modification of the reticle used in the manufacturing steps of the semiconductor device as the first embodiment of the present invention.

To obtain the effect of reducing the aberration of the whole projection lens by allowing the center portion of the projection lens to reach the high temperature and bring the focus value of the exposure light passing therethrough closer to the focus value of the exposure light passing through the end portion of the projection lens, focus correction may be performed appropriately using only the automatic focus correction mark F2 in the center portion of the actual device region D1 without using the automatic focus correction marks in the vicinity of the end portion of the actual device region D1, such as the automatic focus correction marks F1 in the recto R1 shown in FIG. 13, for a focus correcting operation. That is, as shown in FIG. 24, by performing automatic focus correction using only the automatic focus correction marks F2 in the center portion of the actual device region D1, it is possible to reduce the aberration of the projection lens that inherently has aberration as described above, and use the projection lens in a state resulting in a generally small difference in focus value. This brings each of the foci through the center portion and the end portion of the projection lens to the best focus, and therefore can prevent the occurrence of a dimensional error due to defocusing. Note that FIG. 24 is a plan view showing a modification of the reticle used in the method of manufacturing the semiconductor device of the first embodiment. In the drawing, only the automatic focus correction mark used for automatic focus correction is hatched.

Even when this involves the use of a plurality of projection lenses having an inherent difference therebetween, it is possible to suppress the occurrence of size variation from one semiconductor wafer to another and from one exposure step (shot) to another due to the inherent difference between the projection lenses. In this case, there is no need to perform automatic focus correction using the automatic focus correction marks in the vicinity of the end portion of the actual device region. Because the number of times the automatic focus correction is performed using the automatic focus correction marks can be reduced, the throughput of the manufacturing steps of the semiconductor device can be improved.

Even when projection lenses which inherently have a focus difference therebetween before exposure is performed as described above are not used, if consideration is given to the fact that variations in focus value due to a heat history are larger in exposure light passing through the center portion of the projection lens through which the actual device region is projected than in exposure light passing through the end portion thereof, it may also be possible to perform automatic focus correction using only one of the automatic focus correction marks F2 located in the center portion of the actual device region D1 of the reticle RT as shown in FIG. 24, without using, e.g., the automatic focus correction marks formed over the recto.

If automatic focus correction is thus performed using only the automatic focus correction mark F2 in the center portion of the actual device region D1, compared to the case where automatic focus correction is performed using only the automatic focus correction marks over a region outside the center portion of the actual element region D1, the occurrence of defocusing can be more effectively suppressed. This is because, if automatic focus correction is performed using only the automatic focus correction marks over a region (e.g., recto R1) outside the center portion of the actual device region D1, it is impossible to detect the focus of exposure light projected on the semiconductor substrate through the center portion of the projection lens through which the focus significantly changes due to a heat history, and perform correction thereon.

In this case, as described above, it is also possible to omit the step of performing automatic focus correction using the automatic focus correction marks in the vicinity of the end portion of the actual device region D1. Therefore, it is possible to improve the throughput of the manufacturing steps of the semiconductor device.

In the first embodiment, the description has been given using, as an example, a stepper which is an exposure apparatus using a step-and-repeat method in which the upper surface of one semiconductor substrate is repeatedly subjected to exposure steps using the reticle RT over which the largest possible number of chip patterns CP are arranged in the rectangular actual device region Di shown in FIG. 24. However, the present invention is also applicable to a scanner.

Figure 25:
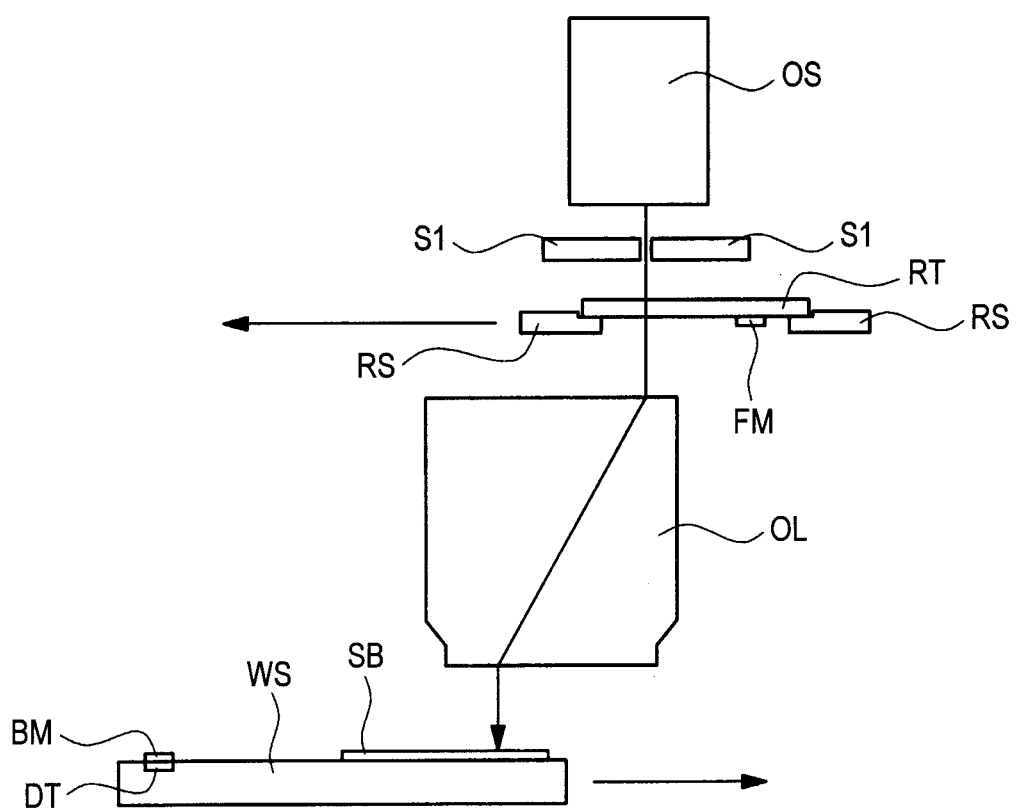
FIG. 25 is a schematic view showing a modification of a projection exposure apparatus used in the manufacturing steps of the semiconductor device as the first embodiment of the present invention.

FIG. 25 shows a schematic view of a scanner (scanning reduction projection exposure apparatus) used in the modification of the method of manufacturing the semiconductor device of the first embodiment. As shown in FIG. 25, the scanner has a configuration similar to that of the stepper shown in FIG. 1, but is greatly different from the stepper in that the reticle stage RS for holding the reticle RT is movable in the front-rear and lateral directions (X- and Y-directions), and the scanner has a field stop plate Si having a slit between the reticle RT and the exposure illumination system OS. The scanner is a type of exposure apparatus for transferring the mask pattern of the reticle Rt onto the semiconductor substrate SB. Specifically, the scanner is an apparatus which performs exposure of the semiconductor substrate SB by applying exposure light in which, to use the slit-like portion of a projection lens with small aberration, a cross section of the light flux is reduced into a slit-like shape using the field stop plate S1, and moving the reticle stage. RS to effect scanning corresponding to one chip, while simultaneously moving the wafer stage WS for. scanning. At this time, as shown by the arrows in FIG. 25, the reticle stage ES and the wafer stage WS are simultaneously moved in opposite directions for scanning.

In the stepper, the square or rectangular portion inscribed on the projection lens is used as an actual device region while, in the scanner, the slit-like portion of the projection lens with small aberration can be used. In addition, since an exposure region is determined by the long side of the slit and the distance over which the reticle stage RS is moved for scanning, the exposure region larger than that obtained in the stepper can be obtained.

Compared to the stepper, the scanner can perform exposure using the region of the projection lens with smaller aberration. However, in the same manner as in the stepper described above, when exposure is performed, the center portion of the projection lens reaches a high temperature and a focus value difference is produced between exposure light passing through the end portion of the projection lens and exposure light passing through the center portion thereof. Therefore, by applying the present invention, it is possible to prevent the occurrence of a dimensional error in a pattern formed over the semiconductor substrate.

(Second Embodiment)

In the foregoing first embodiment, the description has been given to the case where focus correction is performed using the automatic focus correction marks F1 in the recto R1 and the automatic focus correction marks F2 in the center portion of the actual device region D1, as shown in FIG. 13, and to the case where focus correction is performed using only the automatic focus correction mark F2 in the center portion of the actual device region D1, as shown in FIG. 24.

Figure 26:
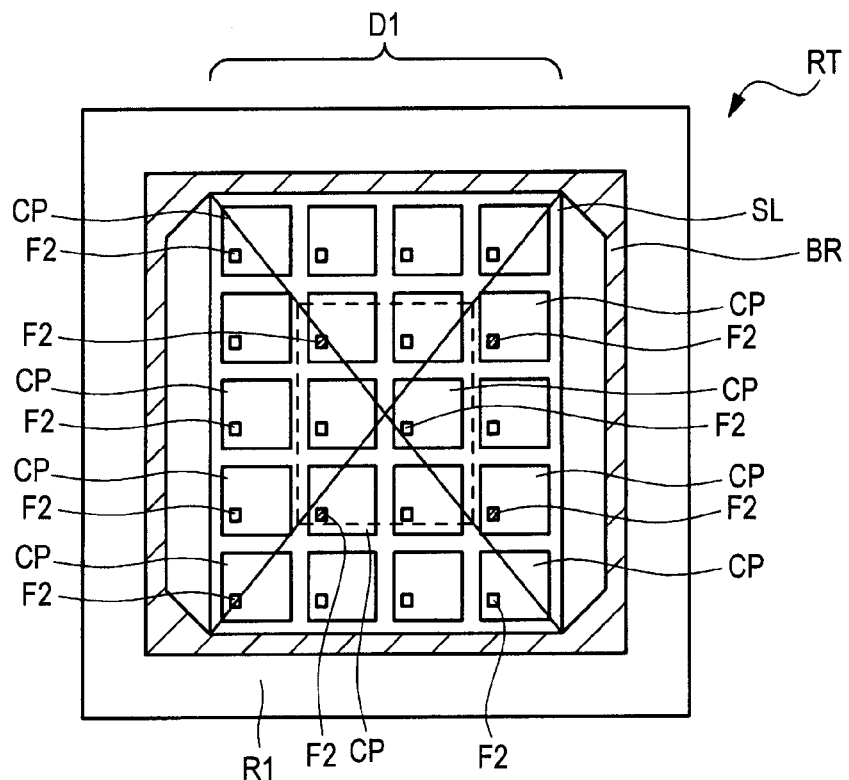
FIG. 26 is a plan view of a reticle used in the manufacturing steps of a semiconductor device as a second embodiment of the present invention.

In the second embodiment, a description will be given to a method in which, as shown in FIG. 26, automatic focus correction is performed using, of the automatic focus correction marks F2 formed in the chip patterns CP arranged in the actual device region D1 over the reticle RT such that each of the chip patterns CP includes at least one of the automatic focus correction marks F2, the four located in the vicinity of the corner portions of the rectangular center portion (region enclosed by the broken line) of the actual device region D1 described above. FIG. 26 is a plan view showing a reticle used in an exposure step of the manufacturing steps of a semiconductor device of the second embodiment. In FIG. 26, only the automatic focus correction marks used for automatic focus correction are hatched.

The manufacturing steps of the semiconductor device manufactured in the second embodiment are substantially the same as in the method described using FIGS. 1 to 23, but are different from those of the foregoing first embodiment in a manner of selecting the automatic focus correction marks used in automatic focus correction. Specifically, automatic focus correction is performed using the automatic focus correction marks F2 located in the vicinity of points located on the diagonal lines of the rectangular actual device region D1 and at distances each corresponding to a quarter of the length of each of the diagonal lines from the end portions of the diagonal lines of the actual device region D1. In other words, the automatic focus correction is performed using the automatic focus correction marks F2 located in the vicinity of the points located on the diagonal lines of the actual device region D1 and at distances each corresponding to a quarter of the length of each of the diagonal lines from a place where the diagonal lines of the rectangular actual device region D1 intersect. It is assumed that the automatic focus correction marks F2 located in the vicinity of the points located on the diagonal lines of the actual device region D1 and at distances each corresponding to a quarter of the length of each of the diagonal lines from the end portions of the diagonal lines of the actual device region D1 indicate, e.g., the automatic focus correction marks F2 closest to the foregoing points.

This means that the automatic focus correction marks F2 located in the vicinity of middle points between the center of the actual device region D1 and the four corner portions of the actual device region D1 are used. That is, the automatic focus correction marks F2 thus selected are each located at a place where a distance from the center portion of the actual device region D1 is substantially the same as a distance from the closest corner portion of the actual device region D1.

By thus using the automatic focus correction marks F2 closer to each of the center portion and the end portion of the actual device region D1 for a correcting operation, it is possible to perform substantially uniform automatic correction of foci through the entire reticle RT by a reduced number of correcting operations based only on the automatic focus correction marks F2 at the four places. Therefore, in the same manner as in the foregoing first embodiment, it is possible to perform focus correction in response to variations in the focus of exposure light passing through, the center portion of the projection lens due to a heat history, and prevent the occurrence of a dimensional error in the semiconductor device resulting from defocusing. In addition, since the number of times the correcting operation is performed can be reduced compared to the case where the focus correcting operation is performed based on the automatic focus correction marks at five or more places, the throughput of the manufacturing of the semiconductor device can be improved.

Such an effect can be obtained because, even when the focus difference between exposure light passing through the end portion of the projection lens and exposure light passing through the center portion thereof is not strictly detected, if a correcting operation is performed using the automatic focus correction marks F2 at the middle points between the end portion and the center portion of the actual device region D1 over the reticle RT corresponding to the end portions and center portion of the projection lens, it is possible to bring the foci through the entire projection lens including the foci through the end portion of the projection lens and through the center portion thereof to the best focus. In this manner, it is possible to prevent a situation such that, by performing correction of only the focus corresponding to the center of the actual device region D1, correction of the focus corresponding to the vicinity of the end portion of the actual device region D1 cannot be performed at all.

(Third Embodiment)

Figure 27:
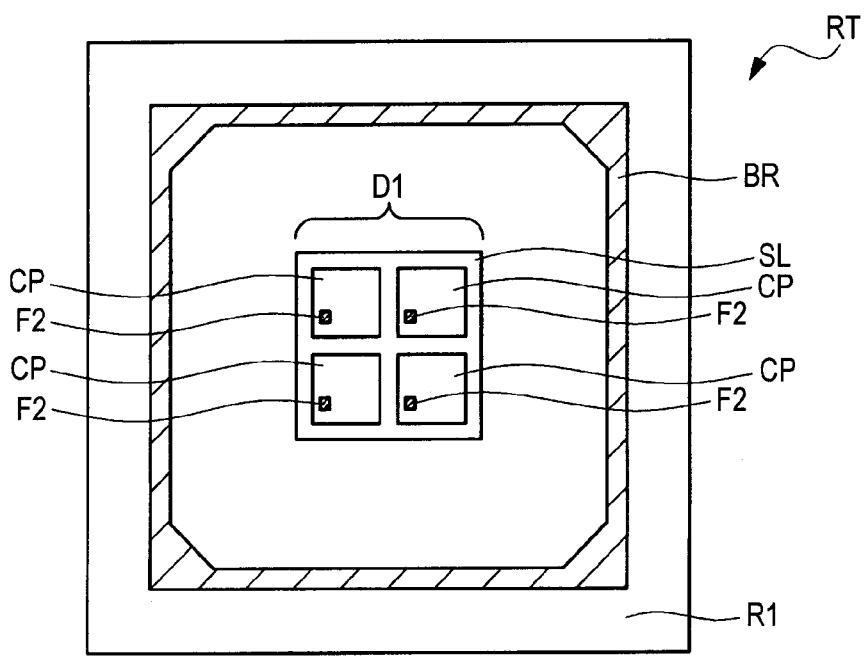
FIG. 27 is a plan view of a reticle used in the manufacturing steps of a semiconductor device as a third embodiment of the present invention.

In the third embodiment, a description will be given not to a case where, as shown in FIGS. 13 and 26, the actual device region D1 is formed to occupy a largest possible area within the light blocking range BR, but to a case where, as shown in FIG. 27, the actual device region D1 is disposed at a large distance from the light blocking range BR. FIG. 27 is a plan view of the reticle RT used in a method of manufacturing a semiconductor device of the third embodiment. In FIG. 27, only the automatic focus correction marks used in automatic focus correction are hatched.

The manufacturing steps of the semiconductor device of the third embodiment are performed in the same manner as in the foregoing first and second embodiments but, as shown in FIG. 27, the arrangement of the chip patterns CP in the reticle RT is different from that in each of the foregoing first and second embodiments. As shown in FIG. 27, the actual device region D1 over the reticle RT is disposed in the center portion surrounded by the light blocking range BR and, between the actual device region D1 and the light blocking range BR, there is a space in which the chip patterns CP in the actual device region D1 can be further arranged.

The chip patterns CP are thus provided to occupy a relatively small area only in the center portion of the reticle RT in order to use a projection lens which starts to mist from the peripheral edge portion thereof through the use thereof for a longest possible period, and reduce the manufacturing cost of the semiconductor device. That is, the projection lens used for exposure has the tendency to start to mist not from the center portion thereof, but from the end portion thereof due to aging degradation resulting from the use thereof and reach a state where the end portion cannot be used any longer before the center portion can no longer be used. Accordingly, to allow even the projection lens having the misted end portion to be used, the reticle RT in which the chip patterns are not formed in the end portion of the region within the light blocking range BR is used as shown in FIG. 27 to thereby elongate the lifetime of each of the projection lenses in a projection exposure apparatus.

However, in the case of performing exposure of the semiconductor substrate using a reticle as described above and a step-and-repeat technique, the area of the actual device region is small so that, compared to the case where a largest possible number of chip patterns are disposed within the light blocking range and exposure is performed, it is necessary to repeat the exposure a largest possible number of times, and project the chip patterns on the entire surface of the semiconductor substrate by exposure.

When automatic focus correction is performed using the reticle RT shown in FIG. 27, the actual device region Dl of the reticle RT used for exposure is only the center portion thereof surrounded by the light blocking region BR. Accordingly, focus correction is performed using the automatic focus correction marks F2 formed in the individual chip patterns CP located in the center portion or one of the automatic focus correction marks F2 in the center portion of the actual device region D1. In this manner, the same effect as obtained in the foregoing first embodiment can be obtained.

In the third embodiment, the chip patterns are not formed in the end portion of the region in the light blocking range BR, i.e., in the vicinity of the recto R1. Therefore, if automatic focus correction is performed using the automatic focus correction marks in the chip patterns, compared to the case where automatic focus correction is performed using only the automatic focus correction marks formed over the recto, the occurrence of defocusing can be prevented particularly effectively.

(Fourth Embodiment)

Figure 28:
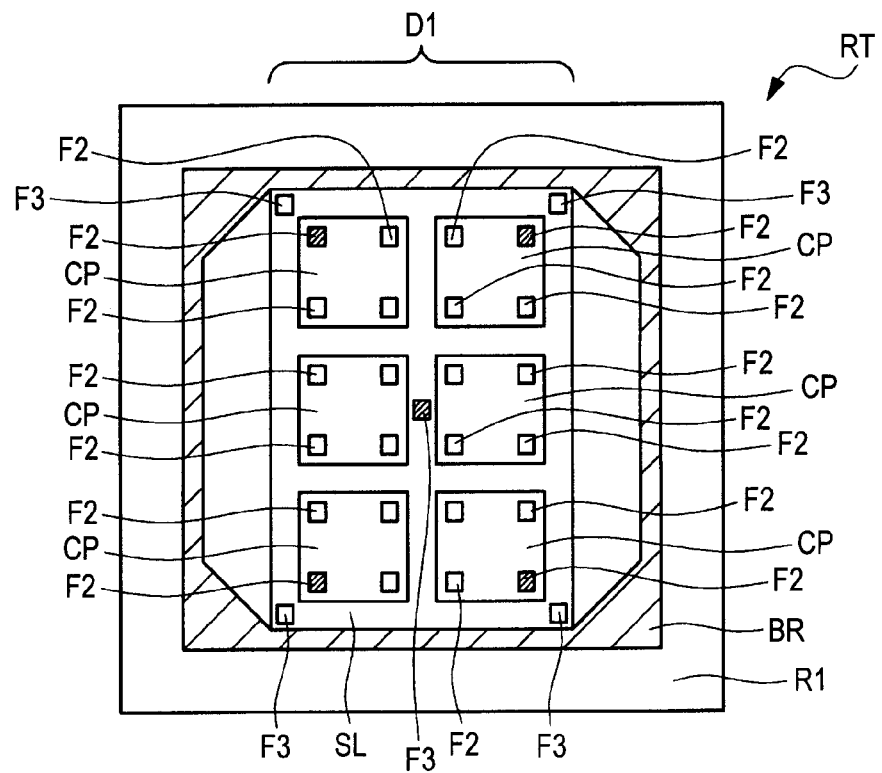
FIG. 28 is a plan view of a reticle used in the manufacturing steps of a semiconductor device as a fourth embodiment of the present invention.

In the fourth embodiment, a description will be given to a method of manufacturing a semiconductor device when automatic focus correction is performed using the reticle RT in which the automatic focus correction marks F2 are provided in the four corners of each of the chip patterns CP in the actual device region D1 over the reticle RT, and automatic focus correction marks (alignment marks) F3 are also provided in the scribe lines SL. FIG. 28 is a plan view showing a reticle used in an exposure step in the manufacturing steps of the semiconductor device of the fourth embodiment. In FIG. 28, only the automatic focus correction marks used for automatic focus correction are hatched.

The manufacturing steps of the semiconductor device manufactured in the fourth embodiment are substantially the same as in the method described using FIGS. 1 to 23, but are different from those of the foregoing first embodiment in a manner of selecting and arranging the automatic focus correction marks used in automatic focus correction over the reticle.

Specifically, as shown in FIG. 28, in the respective inner corner portions of a largest possible number of the chip patterns CP arranged in the actual device region D1, the automatic focus correction marks F2 are formed. That is, each of the rectangular chip patterns CP has the automatic focus correction marks F2 in the individual corner portions thereof. That is, in each of the chip patterns CP, the four automatic focus correction marks F2 are disposed.

Also, in the scribe lines SL of the reticle RT serving as regions cut in a dicing step when projected on the semiconductor substrate, the automatic focus correction marks F3 each having the same structure as that of each of the automatic focus correction marks F2 (see FIG. 5) in the chip patterns CP are formed. Here, the automatic focus correction marks F3 are disposed in the four corner portions of the rectangular outer peripheral portion of the scribe lines SL, over the respective middle portions of the two opposing sides of the outer peripheral portion, and over the middle portion of the scribe lines SL. It is assumed that the middle portion of the scribe lines SL is a part of the scribe lines SL overlapping, e.g., the center point of the actual device region D1. That is, the automatic focus correction marks F3 are alignment marks disposed in the center portion and the end portion of the reticle RT.

In the automatic focus correcting operation when the projection exposure apparatus is used in the fourth embodiment, of all the automatic focus correction marks F2 formed over the plurality of chip patterns CP of the reticle RT shown in FIG. 28, the four automatic focus correction marks F2 closest to the corner portions of the actual device region D1 and the automatic focus correction mark F3 in the middle portion of the foregoing scribe lines SL are used.

That is, the automatic focus correcting operation is performed based on those of the automatic focus correction marks formed at the center portion and the corner portions of the actual device region D1 located at places particularly close to the chip patterns CP. By thus selecting the automatic focus correction marks closest to the chip patterns CP as regions actually operating as semiconductor chips, it is possible to more precisely correcting foci in the regions where devices are actually formed, and prevent the occurrence of defocusing more effectively than in the case of using only the automatic focus correction marks outside the actual device region D1.

Here, by providing the automatic focus correction marks in the four inner corners of the chip patterns CP and also in the scribe lines SL, the possible candidate automatic focus correction marks to be selected are increased to allow foci in the region where precise focus correction is desired to be detected and corrected. Note that, since the automatic focus correction marks F3 are provided on the scribe lines SL, in the scribe regions of the semiconductor substrate on which the scribe lines SL are projected, the same structures as the structures in the form of stripes including the silicon films 8 shown in the correction-mark projection exposure region C1 of FIGS. 16 and 21 are formed.

(Fifth Embodiment)

Figure 29:
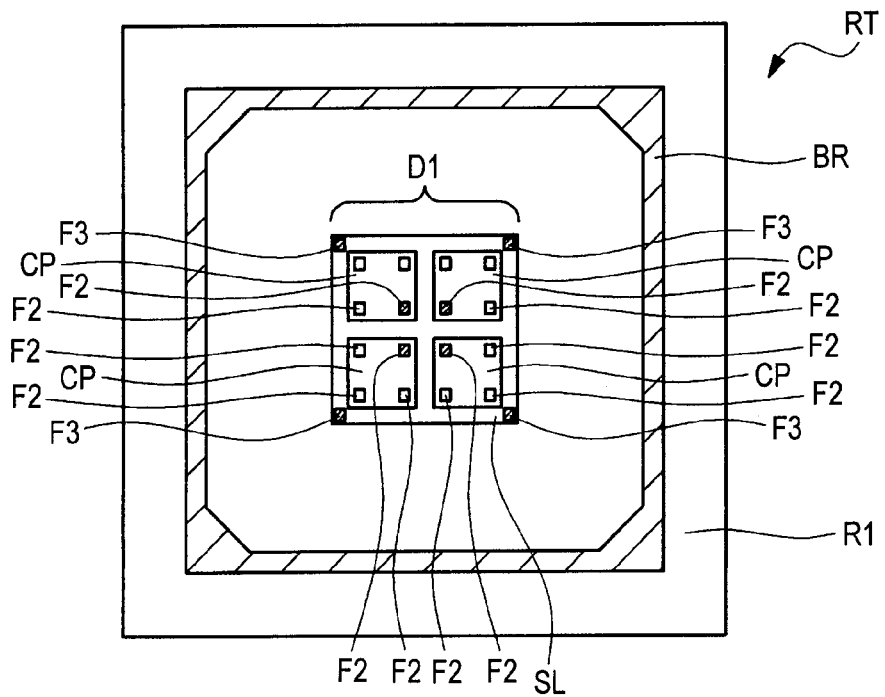
FIG. 29 is a plan view of a reticle used in the manufacturing steps of a semiconductor device as a fifth embodiment of the present invention.

In the fifth embodiment, a description will be given to the case where, as shown in FIG. 29, the automatic focus correction marks are provided over each of the scribe lines SL and the actual device region D1 which are formed over the region of the reticle RT distant from the light blocking range BR or the recto R1. FIG. 29 is a plan view showing a reticle used in the exposure step of the manufacturing steps of a semiconductor device of the fifth embodiment.

The layout of the reticle RT used in the fifth embodiment has the plurality of chip patterns CP disposed in the center portion surrounded by the right blocking range BR at a large distance therefrom, similarly to that of the reticle described in the foregoing third embodiment. However, in the four corner portions of the rectangular outer periphery of the scribe lines SL located to surround the chip pattern CP, the respective automatic focus correction marks F3 are formed and, in the four inner corner portions of the chip patterns CP in the actual device region DI also, the respective automatic focus correction marks F2 are formed.

The manufacturing steps of the semiconductor device manufactured in the fifth embodiment are substantially the same as in the foregoing third embodiment, but are different from those of the foregoing third embodiment in a manner of selecting and arranging the automatic focus correction marks used in automatic focus correction over the reticle.

In the fifth embodiment, a focus correcting operation is performed using the four automatic focus correction marks F3 formed in the corner portions of the scribe lines SL, and those of the automatic focus correction marks F2 located in the four chip patterns CP closest to the center point of the actual device region D1 located in the scribe lines SL which are closest to the foregoing center point.

This allows the same effect as obtained in the foregoing third embodiment to be obtained. Note that, here, by using the four automatic focus correction marks F2 close to the actual device region D1 and the automatic focus correction marks F3 close to the four corners of the actual device region D1, the occurrence of defocusing can be suppressed more effectively than in the foregoing third embodiment.

When the actual device region Dl is formed at a location distant from the recto R1 as in the reticle RT shown in FIG. 29, i.e., when the chip patterns CP are formed only over the center portion of the reticle RT, the center portion of the projection lens used for exposure is locally and exclusively irradiated with exposure light, while the end portion of the projection lens therearound is hardly irradiated with the exposure light. Accordingly, a temperature difference is likely to be produced particularly between the center portion and the end portion of the projection lens. In the case of using a reticle in which the ratio of the area occupied by the chromium pattern is low, a variation in focus value in the center portion of the projection lens is particularly large. Therefore, it is desirable to primarily select the automatic focus correction marks close to the center portion of the actual device region D1. This is because, since the actual device region is small, the number of times exposure is performed on the upper surface of the semiconductor substrate using a step-and-repeat technique increases to increase an amount of heat absorbed by the center portion of the projection lens. By thus selecting the automatic focus correction marks in accordance with the rate of occupation of the reticle surface by the chromium pattern or the layout thereof, it is possible to suppress variations in the focus value of the exposure light passing through the projection lens, and also suppress variations in the focus value of exposure light through the projection lens.

(Sixth Embodiment)

Figure 30:
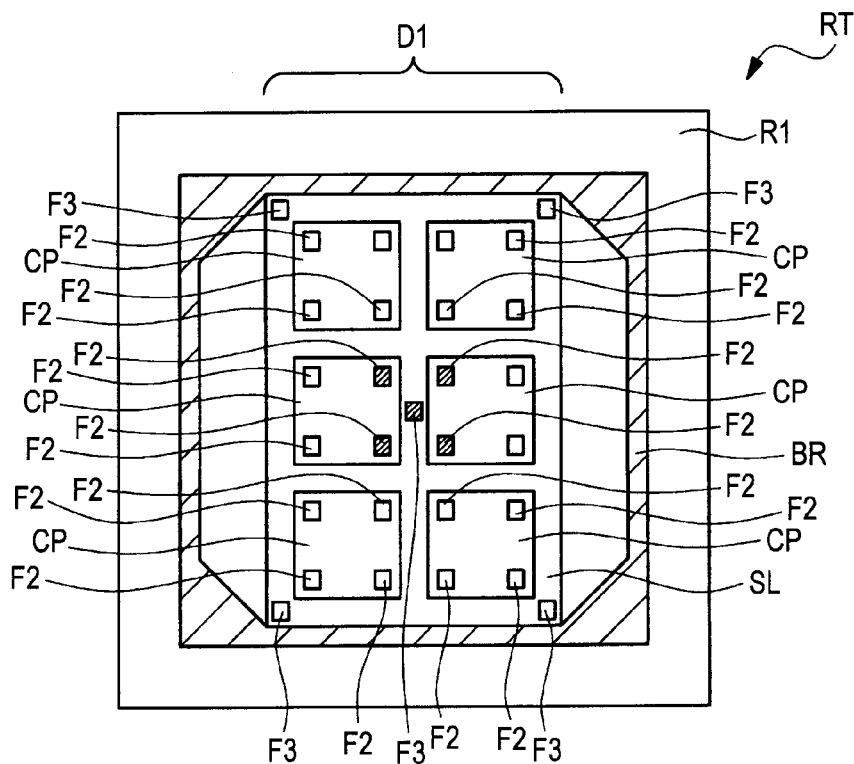
FIG. 30 is a plan view of a reticle used in the manufacturing steps of a semiconductor device as a sixth embodiment of the present invention.

In the sixth embodiment, a description will be given to the case where exposure is performed using a reticle having the same configuration as that of the reticle described using FIG. 28 in the foregoing fourth embodiment. FIG. 30 is a plan view showing a reticle used in the exposure step of the manufacturing steps of a semiconductor device of the sixth embodiment.

The reticle shown in FIG. 30 has the same structure as that of the reticle shown in FIG. 28, but is different in automatic focus correction marks selected to perform automatic focus correction. Specifically, a focus correcting operation is performed using the one automatic focus correction mark F3 formed at the middle of the scribe lines SL, and the four automatic focus correction marks F2 closest to the center portion of the scribe lines SL, i.e., the center portion of the actual device region D1. Here, of the four automatic focus correction marks F2 formed in each of the two respective chip patterns CP adjacent to the center portion of the scribe lines SL, the two closer to the foregoing center portion are selected.

That is, the sixth embodiment has primarily selected the automatic focus correction marks located in the center portion of the actual device region D1 as the automatic focus correction marks to be selected for the automatic focus correcting operation. a result, the automatic focus correction marks disposed in the vicinity of the end portion (outer peripheral portion) of the actual device region D1 have not been selected and used for automatic focus correction.

Consequently, as described in the foregoing first embodiment, in the exposing step using a projection lens in which, if the foci only through the center portion are automatically corrected against an inherent difference between projection lenses and aging degradation, the temperature in the center portion of the projection lens increases to thereby bring the focus through each of the center portion and the end portion of the projection lens close to the best focus, exposure can be performed in a state where the entire projected image is in nearly ideal focus.

When such a projection lens as having locally different aberration due to the inherent difference thereof from another projection lens is used, by selecting those of the plurality of automatic focus correction marks formed over a reticle which are located in a specified region, such focus correction as to suppress variations in accordance with the inherent difference of the projection lens can be performed. Such an effect can be obtained by providing at least one automatic focus correction mark in each of the chip patterns.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, the methods of manufacturing the semiconductor devices of the second to sixth embodiments are applicable to a method of manufacturing a semiconductor device including an exposure step using a scanner, similarly to that of the foregoing first embodiment.

The present invention is effective when applied to a manufacturing technology for a semiconductor device including a semiconductor element having a metal silicide layer.

What is claimed is:

1. A method of manufacturing a semiconductor device, comprising the steps of:
   (a) preparing a reticle having a plurality of chip patterns in an actual device region thereof, and including a first alignment mark in a center portion of the actual device region;
   (b) preparing a semiconductor substrate;
   (c) forming an object to be processed in the semiconductor substrate;
   (d) forming a photoresist film over the object to be processed; and
   (e) exposing the photoresist film to light using the reticle, wherein the first alignment mark is formed in one of a plurality of scribe lines disposed so as to surround each of the chip patterns.

2. A method of manufacturing a semiconductor device according to claim 1,
   wherein the center portion of the actual device region is a range from a center point of the actual device region having a rectangular plan shape and defined by connecting points on diagonals of the actual device region at a distance from the center point corresponding to a quarter of a length of the diagonals.

3. A method of manufacturing a semiconductor device according to claim 1,
   wherein, prior to the step (e), correction of a focus of exposure light is performed using the first alignment mark.

4. A method of manufacturing a semiconductor device according to claim 3,
   wherein a second alignment mark is disposed in an end portion of the reticle.

5. A method of manufacturing a semiconductor device according to claim 4,
   wherein, prior to the step (e), the correction of the focus of the exposure light is performed using the second alignment mark.

6. A method of manufacturing a semiconductor device according to claim 1,
   wherein at least one additional alignment mark is formed in each of the chip patterns.

7. A method of manufacturing a semiconductor device according to claim 4,
   wherein the second alignment mark is formed in one of the chip patterns.

8. A method of manufacturing a semiconductor device according to claim 4,
   wherein the second alignment mark is formed in one of the scribe lines.

9. A method of manufacturing a semiconductor device according to claim 4,
   wherein the second alignment mark is formed outside the actual device region.

10. A method of manufacturing a semiconductor device, comprising the steps of:
    (a) preparing a reticle having a plurality of chip patterns in an actual device region thereof, and including a first alignment mark in a center portion of the actual device region;
    (b) preparing a semiconductor substrate;
    (c) forming an object to be processed in the semiconductor substrate;
    (d) forming a photoresist film over the object to be processed; and
    (e) exposing the photoresist film to light using the reticle,
    wherein, prior to the step (e), correction of a focus of exposure light is performed using the first alignment mark,
    wherein a second alignment mark is disposed in an end portion of the reticle, and
    wherein the second alignment mark is formed in one of a plurality of scribe lines disposed so as to surround each of the chip patterns.

11. A method of manufacturing a semiconductor device according to claim 10,
    wherein the center portion of the actual device region is a range from a center point of the actual device region having a rectangular plan shape and defined by connecting points on diagonals of the actual device region at a distance from the center point corresponding to a quarter of a length of the diagonals.

12. A method of manufacturing a semiconductor device according to claim 10,
    wherein, prior to the step (e), correction of the focus of the exposure light is performed using the second alignment mark.

13. A method of manufacturing a semiconductor device according to claim 10, wherein a respective one of the first alignment mark is formed in each of the chip patterns.

* * * * *